(12) United States Patent
Awad et al.

(10) Patent No.: US 6,965,640 B2
(45) Date of Patent: Nov. 15, 2005

(54) METHOD AND APPARATUS FOR GENERATING A SET OF FILTER COEFFICIENTS PROVIDING ADAPTIVE NOISE REDUCTION

(75) Inventors: Thomas Jefferson Awad, Kirkland (CA); Pascal Marcel Gervais, Montreal (CA); Martin Laurence, Montreal (CA)

(73) Assignee: Octasic Inc., Montreal (CA)

( * ) Notice: Subject to any disclaimer, the term of this patent is extended or adjusted under 35 U.S.C. 154(b) by 780 days.

(21) Appl. No.: 09/925,247

(22) Filed: Aug. 8, 2001

(65) Prior Publication Data

US 2003/0072362 A1 Apr. 17, 2003

(51) Int. Cl.[7] ............................................. H03H 7/30
(52) U.S. Cl. ........................................ 375/232; 375/346
(58) Field of Search .............................. 375/231, 232, 375/233, 346, 290, 229, 371; 708/322

(56) References Cited

U.S. PATENT DOCUMENTS

| | | | |
|---|---|---|---|
| 5,062,102 A | 10/1991 | Taguchi | |
| 5,117,418 A | 5/1992 | Chaffee et al. | |
| 5,200,915 A | 4/1993 | Hayami et al. | |
| 5,329,587 A | 7/1994 | Morgan et al. | |
| 5,375,147 A | 12/1994 | Awata et al. | |
| 5,442,569 A | 8/1995 | Osano | |
| 5,526,426 A | 6/1996 | McLaughlin | |
| 5,630,154 A | 5/1997 | Bolstad et al. | |
| 5,790,598 A | 8/1998 | Moreland et al. | |
| 5,889,857 A | 3/1999 | Boudy et al. | |
| 5,912,966 A * | 6/1999 | Ho | 379/406.05 |
| 5,974,377 A | 10/1999 | Navarro et al. | |
| 6,035,312 A | 3/2000 | Hasegawa | |
| 6,151,358 A | 11/2000 | Lee et al. | |
| 6,246,773 B1 * | 6/2001 | Eastty | 381/71.11 |
| 6,396,872 B1 | 5/2002 | Sugiyama | |
| 6,437,932 B1 | 8/2002 | Prater et al. | |
| 6,483,872 B2 | 11/2002 | Nguyen | |
| 6,622,118 B1 * | 9/2003 | Crooks et al. | 702/190 |
| 6,735,304 B2 * | 5/2004 | Hasegawa | 379/406.08 |
| 6,744,886 B1 | 6/2004 | Benesty et al. | |
| 6,757,384 B1 * | 6/2004 | Ketchum et al. | 379/406.01 |
| 6,768,796 B2 | 7/2004 | Lu | |
| 2002/0114445 A1 * | 8/2002 | Benesty et al. | 379/406.01 |
| 2003/0031242 A1 | 2/2003 | Awad et al. | |
| 2003/0074381 A1 * | 4/2003 | Awad et al. | 708/322 |
| 2003/0084079 A1 * | 5/2003 | Awad et al. | 708/322 |

FOREIGN PATENT DOCUMENTS

| | | |
|---|---|---|
| EP | 0709958 A1 | 5/1996 |
| EP | 0872962 A2 | 10/1998 |
| EP | 0982861 A2 | 3/2000 |
| GB | 2164828 A | 3/1986 |

OTHER PUBLICATIONS

Adaptive filters; Theory and Applications/B. Farhang-Boroujeny. John Wiley & Sons Ltd. (chapter 12, pp. 413–437).

Numerical recipes in C: the art of scientific computing/William H. Press. Cambridge University Press (chapters 1–2, pp. 1–99).

Linear Predictive Spectral Shaping for Acoustical Echo Cancellation. Sanro Zlobec. Department of Electrical Engineering, McGill University, Montreal, Nov. 1995.

Deisher, M.E. et al., "Practical Considerations in the Implementation of a Frequency–Domain Adaptive Noise Canceller", IEEE Transactions on Circuits and Systems, II; Analog and Digital Signal Processing, IEEE Inc. New York, US, vol. 41, No. 2, Feb. 1, 1994, pp. 164–168, XP000443037.

* cited by examiner

*Primary Examiner*—Stephen Chin
*Assistant Examiner*—Jia Lu
(74) *Attorney, Agent, or Firm*—Wolf, Greenfield & Sacks, P.C.

(57) ABSTRACT

A device and method for generating a set of filter coefficients is provided. Sequences of samples of a first and second signal are received where the second signal includes a certain component that is correlated to the first signal. A first set of filter coefficients is generated on the basis of the first and second signals. A set of performance data elements are generated to evaluate the performance of a filter using the first set of coefficients, each performance data element being associated to a respective frequency band selected from a set of frequency bands. Following this, a set of correction signals is generated including a correction signal for each frequency band for which the associated performance data element is indicative of an unsatisfactory performance. A second set of filter coefficients is generated on the basis of the first signal, the second signals and the set of correction signals. The second set of filter coefficients is then released in a format suitable for use by a filter.

33 Claims, 12 Drawing Sheets

METHOD AND APPARATUS FOR GENERATING A SET OF FILTER COEFFICIENTS PROVIDING ADAPTIVE NOISE REDUCTION

CROSS-REFERENCES TO RELATED APPLICATION

This application is related to the following applications:
1. United States Patent Application entitled, "Method and Apparatus for Generating a Set of Filter Coefficients for a Time Updated Adaptive Filter", filed on the same date as the instant application by Awad T. et al.
2. United States Patent Application entitled, "Method and Apparatus for Providing an Error Characterization Estimate of an Impulse Response Derived using Least Squares", filed on the same date as the instant application by Awad T. et al.
3. United States Patent Application entitled, "Method and Apparatus for Generating a Set of Filter Coefficients", filed on the same date as the instant application by Awad T. et al.

The contents of the above noted documents are hereby incorporated by reference.

FIELD OF THE INVENTION

The present invention relates generally to time updated adaptive systems and, more particularly, to a method and apparatus for generating time updated filter coefficients providing adaptive noise reduction. The method and apparatus are suitable for use in a time updated adaptive filter as can be used in echo cancellation devices, equalizers and, in general, systems requiring time updated adaptive filtering.

BACKGROUND

Various adaptive filter structures have been developed for use in time updated adaptive systems to solve acoustical echo cancellation, channel equalization and other problems; examples of such structures include, for example, transversal, multistage lattice, systolic array, and recursive implementations. Among these, transversal finite-impulse-response (FIR) filters are often used, due to stability considerations, and to their versatility and ease of implementation. Many algorithms have also been developed to adapt these filters, including the least-mean-squares (LMS), recursive least-squares, sequential regression, and least-squares lattice algorithms.

The method of least squares is sometimes used to derive a set of filter coefficients in an adaptive filter. A deficiency of the least squares method is that it sometimes produces a set of filter coefficients whose performance, when used by a filter, is dependent upon the spectral properties of the signal being processed. This may result in an adaptive system where the set of filter coefficients will have a satisfactory performance in a first range of frequencies, and a very unsatisfactory performance in a second range of frequencies.

Consequently, there is a need in the industry for providing a filter adaptation unit suitable for producing a set of filter coefficients that alleviates at least in part the deficiencies of the prior art.

SUMMARY OF THE INVENTION

In accordance with a broad aspect, the invention provides a method suitable for producing a set of filter coefficients. A sequence of samples of a first signal and a sequence of samples of a second signal are received, where the second signal includes a certain component that is correlated to the first signal. A first set of filter coefficients is generated at least in part on the basis of the first signal and the second signal. The first set of filter coefficients is such that when a filter applies the first set of filter coefficients on the first signal, a first estimate of the certain component in the second signal is generated. A set of performance data elements is generated to evaluate the performance of a filter using the first set of coefficients on the first signal. The performance is evaluated on a per frequency band basis and each performance data element is associated to a respective frequency band selected from a set of frequency bands. A set of correction signals is generated including a correction signal for each frequency band where the associated performance data element is indicative of an unsatisfactory performance. Following this, a second set of filter coefficients is generated at least in part on the basis of the first signal, the second signals and the set of correction signals. The second set of filter coefficients is such that when a filter applies the second set of filter coefficients on the first signal, a second estimate of the certain component in the second signal is generated. A signal indicative of the second set of filter coefficients is released in a format suitable for use by a filter.

The present inventors have made the unexpected discovery that by adding energy in a given frequency band and generating a second set of filter coefficients, a reduction in the amplitude of the frequency response behavior for the given frequency band could be achieved. The energy in a given frequency band is added by generating a correction signal.

In a specific implementation, the set of frequency bands comprises one or more frequency bands.

In a specific implementation, each correction signal in the set of correction signals is indicative of a signal having signal energy substantially within the frequency band for which it was generated. For example, if the frequency band 1000 Hz±8 Hz is associated performance data element indicative of an unsatisfactory to a performance, a correction signal having signal energy substantially within the frequency band 1000 Hz±8 Hz is generated.

In a non-limiting implementation, the performance data elements are indicative of error signal amplitude estimates for respective frequency bands selected from the set of frequency bands. A performance data element is indicative of an unsatisfactory performance if it is indicative of an error amplitude estimate that exceeds a certain threshold.

Another advantage of this method is that the error performance data elements provide an indication of the performance of the set of filter coefficients on a per frequency basis. This performance indication may be used for improving the performance of the filter coefficients for selected frequency bands in which the performance is unsatisfactory.

In a specific implementation, the method includes generating a first set of contextual information data elements at least in part on the basis of the first and second signals. The first set of filter coefficient is generated on the basis of the first set of contextual information data elements. The first set of contextual information data elements is then processed on the basis of the set of correction signals to generate a modified set of contextual information data elements. The modified set of contextual information data elements is then processed to generate the second set of filter coefficients.

In a non-limiting example, the first set of contextual information data elements includes a set of auto-correlation data elements for the sequence of samples of the first signal and a set of cross-correlation data elements for the sequence of samples of the first signal and the sequence of samples of the second signal. The set of auto-correlation data elements forms a two-dimensional auto-correlation matrix data structure "$A_1$" including a plurality of entries and the cross-correlation data elements form a vector "B". The relationship between the two-dimensional auto-correlation matrix data structure $A_1$ and the cross-correlation data elements form a vector B can be expressed as a set of linear equations:

$$A_1 \cdot h_1 = B \qquad \text{Equation 1}$$

where $h_1$ is a vector including the first set of filter coefficients. The entries of the two-dimensional matrix data structure $A_1$ are modified on the basis of the set of correction signals to generate a modified two-dimensional matrix data structure $A_2$. The relationship between the modified two-dimensional auto-correlation matrix data structure $A_2$ and the cross-correlation data elements form a vector B that can be expressed as a set of linear equations:

$$A_2 \cdot h_2 = B \qquad \text{Equation 2}$$

where $h_2$ is a vector including the second set of filter coefficients. A Cholesky decomposition method is applied to the modified auto-correlation matrix data structure $A_2$ to derive a lower triangular matrix data structure and an upper triangular matrix data structure. The lower triangular matrix data structure and the upper triangular matrix data structure are processed on the basis of the set of cross-correlation data elements to derive the second set of filter coefficients $h_2$.

In accordance with another broad aspect, the invention provides an apparatus for implementing the above-described method.

In accordance with yet another broad aspect, the invention provides a computer readable medium including a program element suitable for execution by a computing apparatus for producing a set of filter coefficients in accordance with the above described method.

In accordance with another broad aspect, the invention provides an adaptive filter including a first input, a second input, a filter adaptation unit and a filter. The first input is for receiving a sequence of samples from a first signal and the second input is for receiving a sequence of samples of a second signal. The second signal includes a component that is correlated to the first signal. The filter adaptation unit receives the samples of the first signal and the second signal from the first and second inputs respectively. The filter adaptation unit includes a coefficient generation unit, a performance evaluation unit, a noise reduction unit and an output. The coefficient generation unit generates a first set of filter coefficients at least in part on the basis of the first and second signals. The first set of filter coefficients is such that when a filter applies the first set of filter coefficients on the first signal, a first estimate of the certain component in the second signal is generated. The performance evaluation unit generates a set of performance data elements for a filter using the first set of coefficients. Each performance data element is associated to a respective frequency band selected from a set of frequency bands. The noise reduction unit determines for each frequency band in the set of frequency bands if the associated performance data element is indicative of a satisfactory performance or an unsatisfactory performance. The noise reduction unit generates a set of correction signals including a correction signal for each frequency band where the associated performance data element is indicative of an unsatisfactory performance. The noise reduction unit then generates a second set of filter coefficients on the basis of the first signal, the second signals and the set of correction signals. The second set of filter coefficients is such that when a filter applies the second set of filter coefficients on the first signal, a second estimate of the certain component in the second signal is generated. A signal indicative of the second set of filter coefficients is released at the output in a format suitable for use by a filter. The filter receives the first signal from the first input and the second set of filter coefficients from the filter adaptation unit. The filter applies a filtering operation to the first signal on the basis of the second set of filter coefficients to generate an estimate of the component in the second signal, the component being correlated to the first signal.

In accordance with another aspect, the invention provides an echo cancellor comprising the above described adaptive filter.

In accordance with yet another aspect, the invention provides a filter adaptation unit suitable for producing a set of filter coefficients. The filter adaptation unit includes means for receiving a sequence of samples of a first signal and means for receiving a sequence of samples of a second signal. The second signal includes a certain component that is correlated to the first signal. The filter adaptation unit also includes means for generating a first set of filter coefficients at least in part on the basis of the first and second signals. The first set of filter coefficients is such that when a filter applies the first set of filter coefficients on the first signal, a first estimate of the certain component in the second signal is generated. The filter adaptation unit also includes means for generating a set of performance data elements for a filter using the first set of coefficients, each performance data element being associated to a respective frequency band selected from a set of frequency bands. The filter adaptation unit also includes means for determining for each frequency band in the set of frequency bands if the associated performance data element is indicative of a satisfactory performance or an unsatisfactory performance. The filter adaptation unit also includes means for generating a set of correction signals including a correction signal for each frequency band where the associated performance data element is indicative of an unsatisfactory performance. The filter adaptation unit also includes means for generating a second set of filter coefficients at least in part on the basis of the first signal, the second signals and the set of correction signals. The second set of filter coefficients is such that when a filter applies the second set of filter coefficients on the first signal, a second estimate of the certain component in the second signal is generated. The filter adaptation unit also includes means for releasing a signal indicative of the second set of filter coefficients in a format suitable for use by a filter.

Other aspects and features of the present invention will become apparent to those ordinarily skilled in the art upon review of the following description of specific embodiments of the invention in conjunction with the accompanying figures.

DETAILED DESCRIPTION

Figure 1:
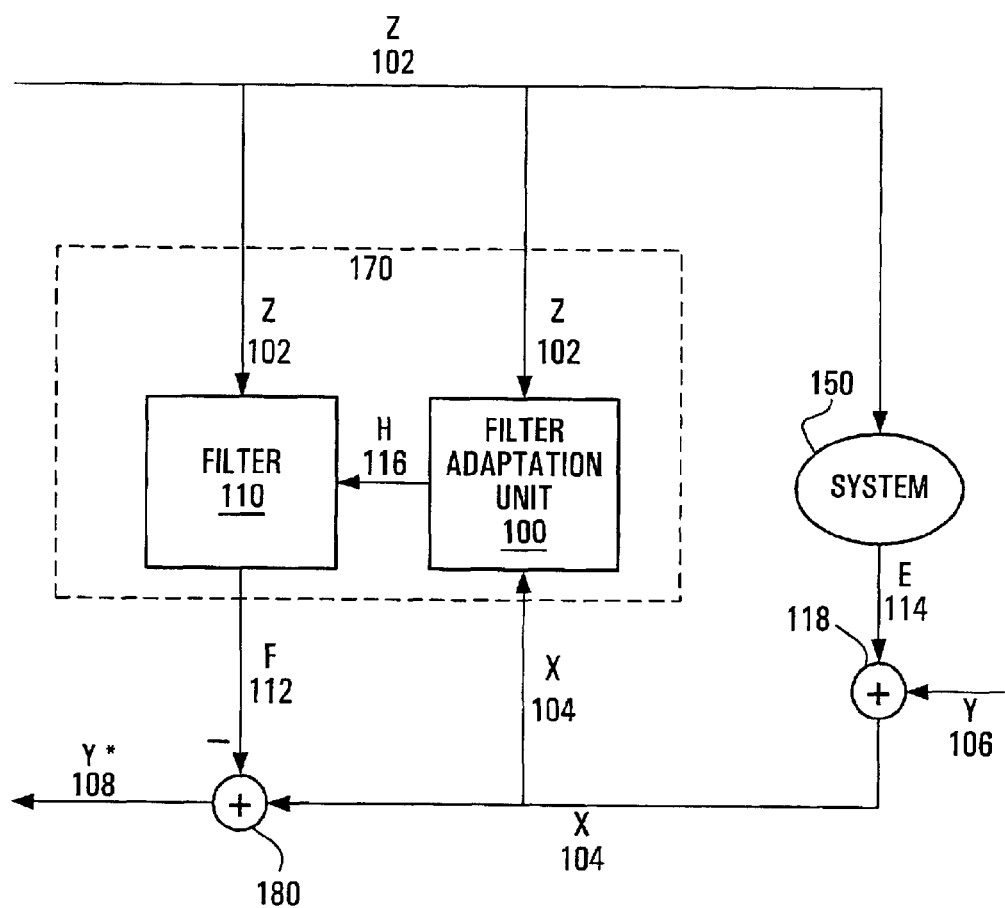
FIG. 1 is a block diagram of a time adaptive system including a filter adaptation unit in accordance with an embodiment of the present invention.

FIG. 1 shows a time adaptive system 170 in accordance with an embodiment of the present invention. In one example of a non-limiting implementation, the time adaptive system 170 is used to remove unwanted components of a return signal Z 102 from a forward signal Y 106. Typically, the return signal Z 102 passes through a system 150 and emerges in the form of a noise signal E 114 which corrupts the forward signal Y 106, resulting in a corrupted forward signal X 104. In a digital system, this corruption process may be modelled as a sample-by-sample addition performed by a conceptual adder 118. Thus, each sample of the corrupted forward signal X 104 is the sum of a component due to the (clean) forward signal Y 106 and another component due to the noise signal E 114 where the noise signal E 114 is correlated to the return signal Z 102.

A non-limiting use of the time adaptive system 170 is in the context of acoustical echo cancellation, for example, in a hands-free telephony system that includes a loudspeaker and a microphone. In this case, the forward signal Y 106 is a locally produced speech signal which is injected into the microphone (represented by conceptual adder 118), the return signal Z 102 is a remotely produced speech signal which is output by the loudspeaker, the system 150 is a room or car interior and the noise signal E 114 is a reverberated version of the return signal Z 102 which enters the same microphone used to pick up the forward signal Y 106. The corrupted forward signal X 104 is the sum of the signals input to the microphone, including the clean forward signal Y 106 as well as the reverberation represented by the noise signal E 114.

Another non-limiting use of the time adaptive system 170 is in the context of electric echo cancellation, for example, where the echo is caused by an analog/digital conversion on the transmission channel rather than by a signal reverberation in a closed space. In this case, the forward signal Y 106 is a locally produced speech signal which travels on the forward path of the communication channel, the return signal Z 102 is a remotely produced speech signal which travels on the return path of the communication channel, the system 150 is an analog/digital conversion unit and the noise signal E 114 is a reflected version of the return signal Z 102 which travels on the same forward path of the communication channel as the forward signal Y 106. The corrupted forward signal X 104 is the sum of the clean forward signal Y 106 as well as the noise signal E 114.

To cancel the corruptive effect of the noise signal E 114 on the forward signal Y 106, there is provided a filter 110, suitably embodied as an adaptive digital filter. The filter 110 taps the return signal Z 102 (which feeds the system 150) and applies a filtering operation thereto. In one embodiment of the present invention, such a filtering operation can be performed by a finite impulse response (FIR) filter that produces a filtered signal F 112.

The filter 110 includes a plurality N of taps at which delayed versions of the return signal Z 102 are multiplied by respective filter coefficients, whose values are denoted $h_j$, $0 \leq j \leq N-1$. The N products are added together to produce the filter output at time T. Simply stated, therefore, the filtered signal F 112 at a given instant in time is a weighted sum of the samples of the return signal Z 102 at various past instances.

The filter coefficients $h_j$ are computed by a filter adaptation unit 100 configured to receive the return signal Z 102 and the corrupted forward signal X 104. The manner in which the filter adaptation unit 100 processes these signals to compute the filter coefficients $h_j$ is described in greater detail herein below.

Mathematically, the filtered signal F 112 at the output of the filter 110 can be described by the following relationship:

$$f_t = \sum_{i=0}^{N-1} h_i z_{t-i} \qquad \text{Equation 3}$$

where t is the current sample time;

$f_t$ is the value of the filtered signal F 112 at time t;

$h_j$ is the value of the $j^{th}$ filter coefficient;

$z_k$ is a sample of the return signal Z 102 at time k; and

N is the length (i.e., the number of taps) of the filter 110.

For convenience, equation 1 may be represented in matrix form as follows:

$$f_t = \underline{h}^T \underline{z}_t \qquad \text{Equation 4}$$

where the underscore indicates a vector or matrix, where the superscript "$T$" denotes the transpose (not to be confused with the sample time "t" used as a subscript) and where:

$$\underline{h} = \begin{bmatrix} h_0 \\ h_1 \\ \ldots \\ h_{N-1} \end{bmatrix} \text{ and } \underline{z}_t = \begin{bmatrix} z_t \\ z_{t-1} \\ \ldots \\ z_{t-(N-1)} \end{bmatrix} \quad \text{Equation 5}$$

The output of the filter 110, namely the filtered signal F 112, is subtracted on a sample-by-sample basis from the corrupted forward signal X 104 to yield an estimate, denoted Y* 108, of the clean forward signal Y 106. In a desirable situation, the filter coefficients $h_j$ will be selected so as to cause the resultant signal Y* 108 to be "closer" to the clean forward signal Y 106 than corrupted forward signal X 104. For at least one optimal combination of filter coefficients, the resultant signal Y* 108 will be at its "closest" to the clean forward signal Y 106.

It is sometimes convenient to define "closeness" in terms of a least-squares problem. In particular, the optimal filter coefficients are obtained by solving an optimisation problem whose object it is to minimise, from among all possible combinations of filter coefficients $h_j$, the mean square difference between instantaneous values of the resultant signal Y* 108 and the clean forward signal Y 106. The actual value of the minimum mean-square error is typically not as important as the value of the optimal filter coefficients that allow such minimum to be reached.

A reasonable assumption is that noise signal E 114 adds energy to forward signal Y 106. Therefore an expression of the least square problem is to minimise the resultant signal Y* 108. Mathematically, the problem in question can be defined as follows:

$$\min_{\underline{h}} E[(y_k^*)^2]_t, \quad \text{Equation 6}$$

where E[○], denotes the expectation of the quantity "○" over a subset of time up until the current sample time t. For the purpose of this specific example, the expression E[○], will denote the summation of the quantity "○" over a subset of time up until the current sample time t. Another commonly used notation is $\Sigma[\circ]_t$. Therefore, for the purpose of this example the expressions $E[\circ]_t$ and $\Sigma[\circ]_t$ are used interchangeably.

Now, from FIG. 1 it is noted that:

$$y^*_k = x_k - f_k = x_k - \underline{h}_k^T \underline{z}_k \quad \text{Equation 7}$$

and $$x_k = y_k + e_k. \quad \text{Equation 8}$$

Therefore, the problem stated in Equation 4 becomes:

$$\min_{\underline{h}} E[(x_k - \underline{h}^T \underline{z}_k)^2]_t, \quad \text{Equation 9}$$

Expanding the term in square brackets, one obtains:

$$(x_k - \underline{h}^T \underline{z}_k)^2 = x_k^2 - 2x_k \underline{h}^T \underline{z}_k + (\underline{h}^T \underline{z}_k)^2. \quad \text{Equation 10}$$

Taking the expected value of both side of equation 8, one obtains:

$$E[(x_k - \underline{h}^T \underline{z}_k)^2]_t = E[x_k^2]_t - 2E[x_k \underline{h}^T \underline{z}_k]_t + E[\underline{h}^T \underline{z}_k \underline{z}_k^T \underline{h}]_t \quad \text{Equation 11}$$

Minimizing the above quantity leads to a solution for which the resultant signal Y* 108 will be at its minimum and likely at its "closest" to the clean forward signal Y 106. To minimize this quantity, one takes the derivative of the right-hand side of Equation 9 with respect to the filter coefficient vector $\underline{h}$ and sets the result to zero, which yields the following:

$$\frac{d}{d\underline{h}}(E[x_k^2]_t - E[2x_k \underline{h}^T \underline{z}_k]_t + E[\underline{h}^T \underline{z}_k \underline{z}_k^T \underline{h}]_t) = \quad \text{Equation 12}$$
$$-2E[x_k \underline{z}_k]_t + 2E[\underline{z}_k \underline{z}_k^T \underline{h}]_t = 0.$$

Thus, an "optimal" set of filter coefficients $h_1$ solves the set of equations defined by:

$$E[\underline{z}_k \underline{z}_k^T]_t \underline{h}_1 = E[x_k \underline{z}_k]_t. \quad \text{Equation 13}$$

It is noted that equation 11 expresses the filter coefficient optimisation problem in the form $A_1 h = B$, where $A_1 = E[\underline{z}_k \underline{z}_k^T]_t$ and $B = E[x_k \underline{z}_k]_t$ and that the matrix $A_1$ is symetric and positive definite for a non-trivial signal Z 102. The usefulness of these facts will become apparent to a person of ordinary skill in the art upon consideration of later portions of this specification.

It is noted that since the properties of the signals Z 102 and X 104 change with time, so too does the optimal combination of filter coefficients $h_1[j]$, $0 \leq j \leq N-1$, which solves the above problem in Equation 11.

Noting that signal X=signal Y+signal E, the above equation 11 can be rewritten as follows:

$$E[\underline{z}_k \underline{z}_k^T]_t \underline{h}_1 = E[(y_k + e_1) \underline{z}_k]_t.$$

$$E[\underline{z}_k \underline{z}_k^T]_t \underline{h}_1 = E[e_k \underline{z}_k]_t + E[y_k \underline{z}_k]_t \quad \text{Equation 14}$$

In other words, we can separate the filter function defined by the set of filter coefficients $h_1[j]$, $0 \leq j \leq N-1$ into two components. The first term on the right hand side of the equation $E[e_k \underline{z}_k]_t$ contributes to the desired filter behaviour since the filter 110 tries to obtain a filter such that signal F 112 equals signals E 114. Therefore, the second term on the right hand side of the equation $E[y_k \underline{z}_k]_t$ contributes to the error behaviour of the filter 110. Therefore the error function can be expressed as follows:

$$E[\underline{z}_k \underline{z}_k^T]_t \text{error\_function}^* = E = [y_k \underline{z}_k]_t. \quad \text{Equation 15}$$

It will be readily observed that where signal Z 102 and signals Y 106 are perfectly uncorrelated, i.e. $E[y_k \underline{z}_k]_t = 0$ for all t, the error function is zero.

In certain cases, it has been observed that the set of filter coefficients $h_1[j]$, $0 \leq j \leq N-1$, have a different performance depending on the frequency components of signal Z 102. For example, take signal Z 102 having energy mainly in the 0 to 2 kHz frequency range and only low energy in the 2 to 4 kHz range, and signal X 104 having the opposite behavior namely low energy in the 0 to 2 kHz range and energy mainly in the 2 to 4 kHz frequency range. It has been observed that the energy of the error function resulting from the use of the filter coefficients $h_1[j]$, $0 \leq j \leq N-1$, will be low in the 0 to 2 kHz frequency range, and high in the 2 to 4 kHz frequency range. A result of the above is that if signal Z 102 includes at some instance of time components having energy in the 2 to 4 kHz range, the use of the filter coefficients may have some undesirable effects due to the energy of the error signals in that range such as for example to amplify signal Z 102 in those frequency bands. The inventors have made the unexpected discovery that by using the error function of the filter, it is possible to provide an new set of filter coefficients which may reduce some undesirable effects described above.

The manner in which the characteristics of the error function are generated and the manner in which they may be used will now be described in greater detail with reference to FIG. 2, which depicts the filter adaptation unit 100 in greater detail.

Filter Adaptation Unit 100

The filter adaptation unit 100 includes a first input 252 for receiving a sequence of samples of a first signal Z 102, a second input 254 for receiving a sequence of samples of a second signal X 104, a coefficient generation unit 200, a performance evaluation unit 202, a noise reduction unit 210 and an output 256 for releasing an output signal indicative of a set of filter coefficients H 116.

Coefficient Generation Unit 200

The coefficient generation unit 200 receives the first signal Z 102 and the second signal X 104 from the first input 252 and the second input 254 respectively. The coefficient generation unit 200 is operative to generate a set of filter coefficients Hnew 206 at least in part on the basis of the first signal Z 102 and the second signal X 104. In a specific example, the coefficient generation unit 200 applies a least squares method on the first signal 102 and second signal 104 to derive a first set of filter coefficients Hnew 206. The coefficient generation unit 200 generates a set of coefficients $h_1[j]$, $0 \leq j \leq N-1$ by solving equation 13 reproduced below:

$$E[z_k z_k^T]_t \underline{h}_1 = E[x_k z_k]_t.  \quad\quad \text{Equation 13}$$

Figure 2:
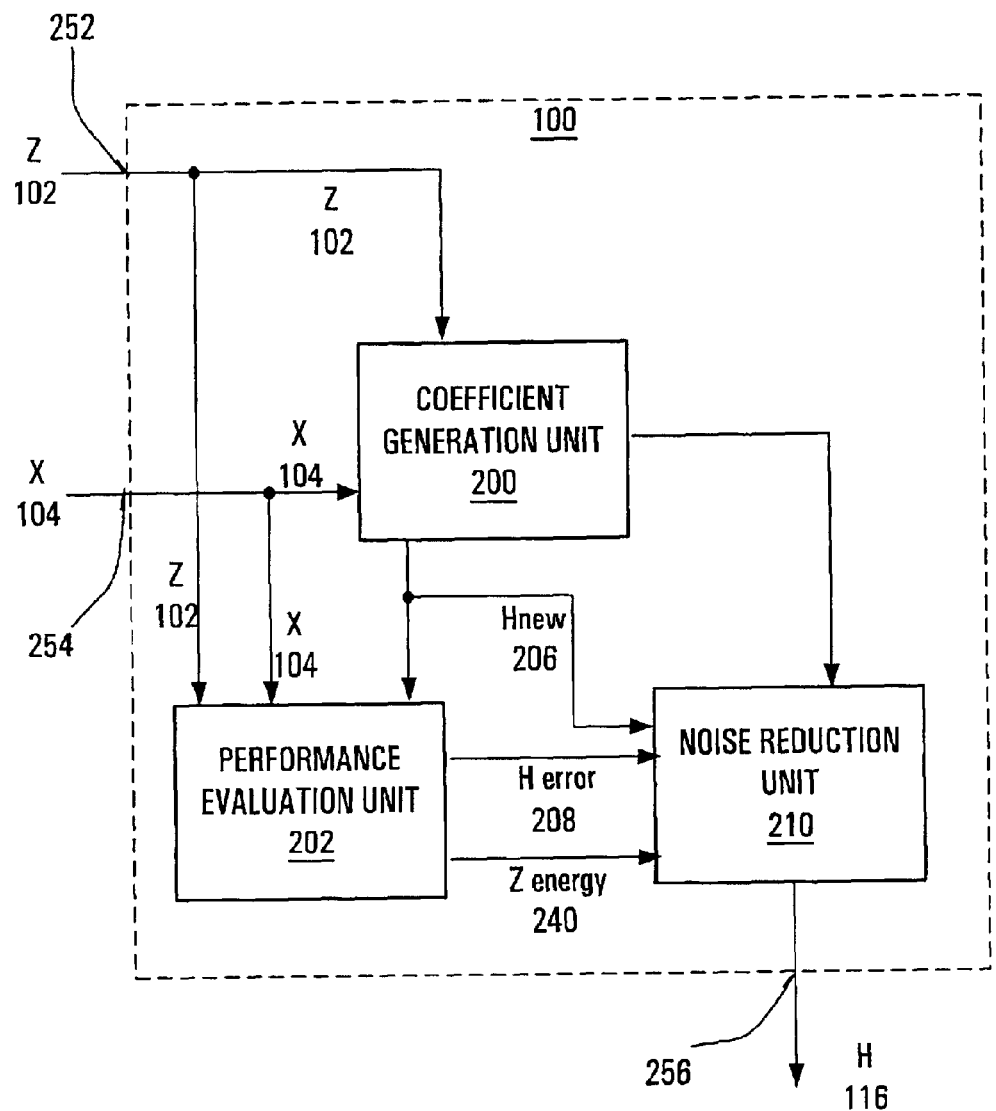
FIG. 2 is a block diagram of the filter adaptation unit of FIG. 1 in accordance with a specific example of implementation of the invention.

The coefficient generation unit 200 releases a first set of coefficients $h_1$, designated as Hnew 206 in FIG. 2.

Figure 3:
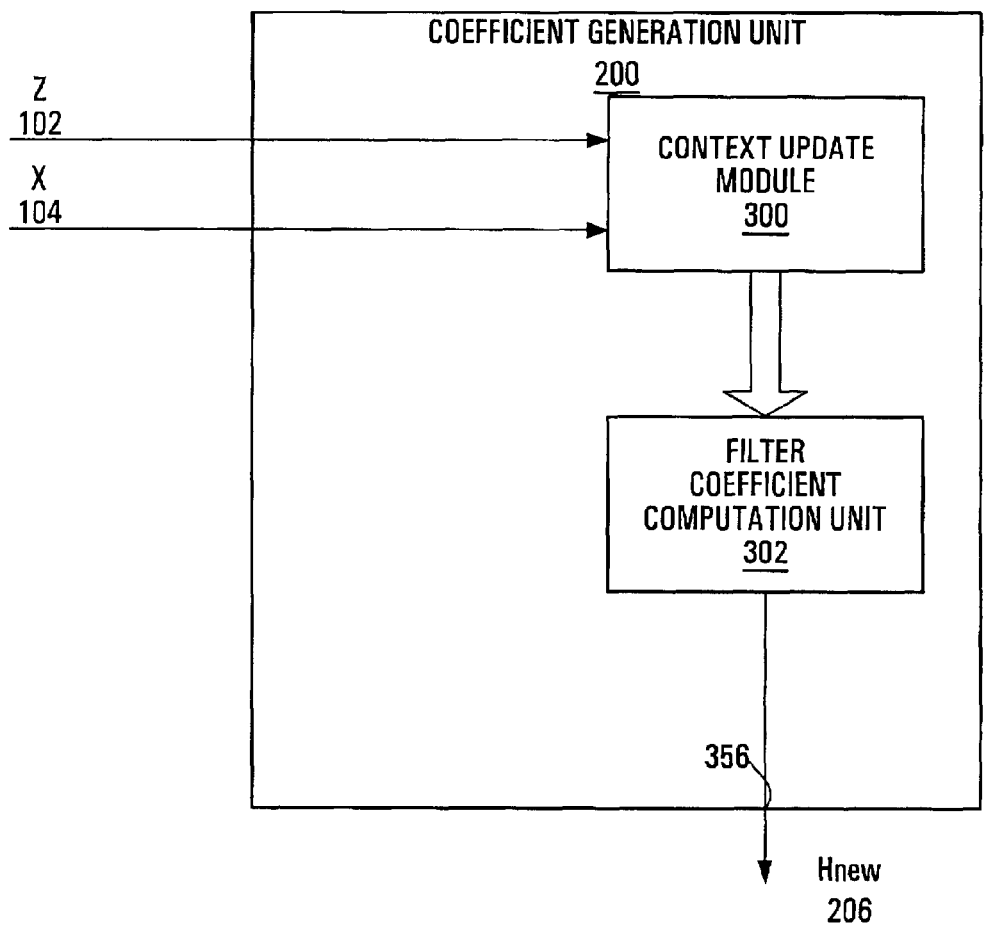
FIG. 3 is a functional block diagram of a coefficient generation unit suitable for use in the filter adaptation unit of FIG. 2 in accordance with a non-limiting example of implementation of the invention.

FIG. 3 shows a specific non-limiting implementation of the coefficient generation unit 200. As shown, the coefficient generation unit 200 includes a context update module 300 and a filter coefficient computation unit 302.

The context update module 300 receives the sequence of samples of the first signal Z 102 and the sequence of samples of the second signal X 104. The context update module 300 generates and maintains contextual information for the first signal Z 102 and the second signal X 104. The context update module 300 maintains sufficient contextual information about signals Z 102 and X 104 to be able to derive $E[z_k z_k^T]_t$ and $E[x_k z_k]_t$ for the current time t. This contextual information is then used by the filter coefficient computation unit 302 to generate the set of filter coefficients Hnew 206. The specific realization of the context update module 300 may vary from one implementation to the other without detracting from the spirit of the invention. For the purpose of this description, the contextual information comprises a first set of data elements and a second set of data elements, where the first set of data elements is indicative of the auto-correlation of signal Z 102 $E[z_k z_k^T]_t$. The second set of data elements is a set of cross-correlation data elements $E[x_k k_k]_t$ of the first signal Z 102 with the second signal X 104.

Figure 4:
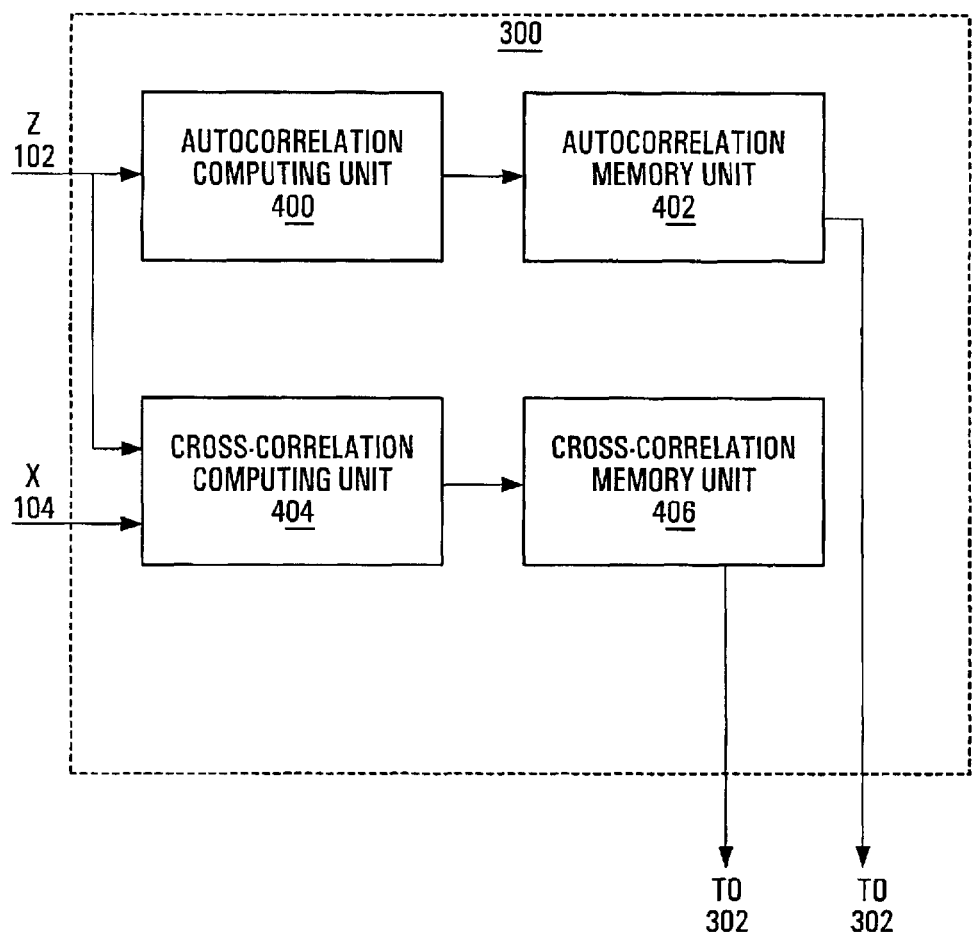
FIG. 4 is a functional block diagram of a context update module suitable for use in the coefficient generation unit of FIG. 3 in accordance with a non-limiting example of implementation of the invention.

FIG. 4 depicts the context update module 300 in greater detail. The context update module 300 includes an auto-correlation computing unit 400 and a cross-correlation computing unit 404.

The auto-correlation computing unit 400 generates a first set of data elements indicative of an auto-correlation data structure for the sequence of samples of the first signal Z 102 and is indicative of $E[z_k z_k^T]_t$ since time 0. In a specific example, the first set of data elements can be represented by an N×N auto-correlation matrix $A_1$ 700 of the type shown in FIG. 7 including $N^2$ entries. The N×N auto-correlation matrix $A_1$ 700 is symmetric meaning that:

$$A_1 = A_1^T$$

Matrix $A_1$ 700 is also positive definite meaning that the inverse of matrix $A_1$ exists. Since matrix $A_1$ is an auto-correlation matrix, it will be positive definite when signal Z 102 is non-trivial. The N×N data elements of the auto-correlation matrix $A_2$ 700 are stored in a data structure in an auto-correlation memory unit 402. For each received sample of signal Z 102, the contents of the auto-correlation memory unit 402 are updated. The generation of an auto-correlation matrix is well-known in the art to which this invention pertains and as such will not be described further here. There are many ways in which the auto-correlation matrix $A_1$ may be generated and the invention is not limited to the manner in which the auto-correlation matrix is obtained. A specific manner in which the auto-correlation matrix may be updated and generated is described in co-pending patent application entitled "METHOD AND APPARATUS FOR GENERATING A SET OF FILTER COEFFICIENTS FOR A TIME UPDATED ADAPTIVE FILTER" filed on same date as the present invention by Thomas J. Awad et al. whose contents are hereby incorporated by reference.

Figures 6, 7:
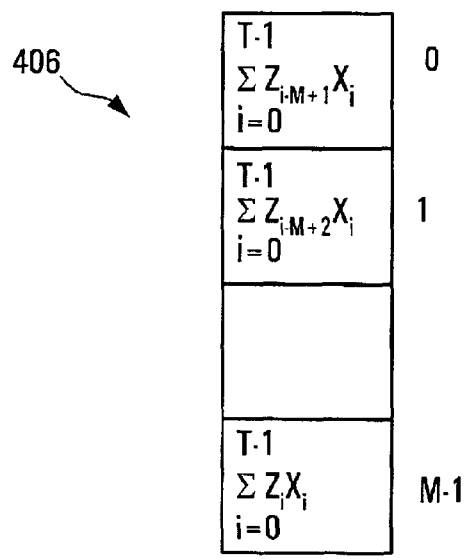
FIG. 6 is a block diagram of a data structure including a set of cross-correlation data elements in accordance with a non-limiting example of implementation of the invention.
FIG. 7 shows an auto-correlation matrix data structure in accordance with a non-limiting example of implementation of the invention.

The cross-correlation computing unit 404 computes a second set of data elements including a set of cross-correlation data elements between the signals Z 102 and X 104 indicative of $E[x_k z_k]_t$. For each received sample of the first signal Z 102 and the second signal X 104, the cross-correlation computing unit 404 computes the following for $t \geq M$:

$$E[x_k z_k]_{t,j} = \sum_{i=0}^{t-1} z_{i+j-M+1} x_i \text{ for } j = 0 \ldots M-1 \quad\quad \text{Equation 16}$$

Where $x_{t-1}$ is a new sample of the signal X 104 at time T, $z_{t-1}$ is a new sample of Z 102 at time t and M is the window size for the cross-correlation computation. In the mathematical expression shown in the above equation, $E[x_k z_k]_t$ denotes a computation of the expected value of the cross-correlation between the first signal Z 102 and the second signal X 104 since time 0 (no sample) until the current sample at time t. $E[x_k z_k]_t$ is a set of M cross-correlation data elements. The M cross-correlation data elements are stored in a data structure in a cross-correlation memory unit 406. FIG. 6 shows the cross-correlation memory unit 406 storing a data structure in the form of a vector of M elements including the M cross-correlation data elements. For the purpose of simplicity, we will refer to the set of M cross-correlation data elements in memory unit 406 as vector XZ. For each received sample of signal X 104 and each received sample of signal Z 102, the content of vector XZ in the cross-correlation memory unit 406 is updated as follows:

$$XZ[j]_t = XZ[j]_{t-1} + z_{t-1-j} x_{t-1} \text{ for } j=0 \ldots M-1 \quad\quad \text{Equation 17}$$

where $t \geq M$.

In a non-limiting embodiment, the context update module 300 includes buffer modules for accumulating samples of signal Z 102 and signal X 104. In this alternative, a plurality of samples of signal Z 102 and a plurality of samples of signal X 104 are accumulated in the buffers and the above described computations are effected for each sample of signal Z 102 and signal X 104 in the buffers.

Alternatively, when the context update module 300 includes buffer modules, the auto-correlation matrix $A_1$ and the cross-correlation data elements in vector XZ may be computed in the frequency domain using FFT (Fast Fourier transform) techniques. The set of auto-correlation and cross-correlation data elements resulting from this computation are in the frequency or spectral domain. To obtain the temporal values of the set of auto-correlation and cross-correlation data elements, an Inverse Fourier Transform (IFF) must be applied to the spectral values. The process of computing an auto-correlation and a cross-correlation in the spectral domain between signal Z 102 and signal X 104 is well-known to the person skilled in the art and therefore will not be described further here.

The filter coefficient computation unit 302 makes use of the contextual information provided by the context update module 300 to generate a set of filter coefficients Hnew 206. The frequency of the computation of the new set of filter coefficients Hnew 206 may vary from one implementation to the other without detracting from the spirit of the invention. In a non-limiting example, a new set of filter coefficients Hnew 206 is computed every L samples of signals Z 102, where L is >=2.

Figure 5:
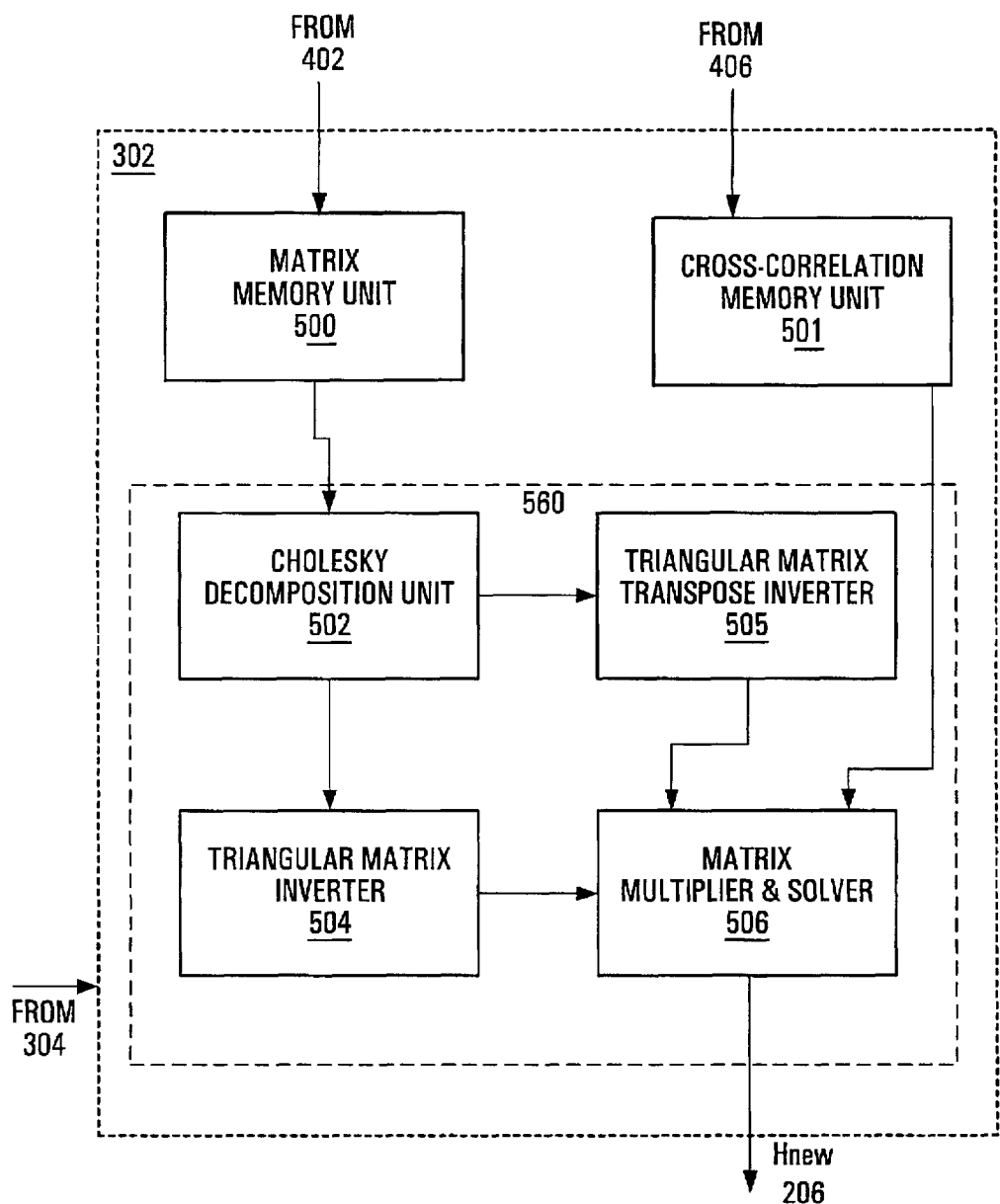
FIG. 5 is a functional block diagram of a filter coefficient computation unit suitable for use in the coefficient generation unit of FIG. 3 in accordance with a non-limiting example of implementation of the invention.

FIG. 5 shows the filter coefficient computation unit 302 in greater detail in accordance with a non-limiting implementation. The filter coefficient computation unit 302 includes a matrix memory unit 500 for storing the N×N matrix $A_1$, cross correlation memory unit 501 for storing cross-correlation vector XZ and a linear solver unit 560. Although the matrix memory unit 500 of the filter coefficient computation unit 302 and the auto-correlation memory unit 402 of the context update module 300 are shown as separate components, it will be readily appreciated that they may be embodied in a same physical device and may share functional components without detracting from the spirit of the invention.

The linear solver unit 560 processes the N×N auto-correlation matrix $A_1$ in matrix memory unit 500 in combination with cross-correlation vector XZ from the cross-correlation memory unit 501 to solve the following linear system for a set of filter coefficients in vector $h_1$:

$$A_1 \cdot h_1 = XZ \qquad \text{Equation 18}$$

where $A_1$ is an N×N positive definite symmetric matrix, $h_1$ is an 1×N vector and XZ is an 1×M vector. If M=N, a single vector $h_1$ can be computed from the above equation. If M>N, then a vector $h_1$ of dimension 1×N can be computed for subsets of N elements of vector "XZ". For the purpose of simplicity, we will describe the case where N=M, and where one set of filter coefficients is generated by the filter coefficient computation unit 302 by solving equation 18. There are many known methods that can be used to solve linear systems and consequently all these will not be described further herein. Typically, the inverse of matrix $A_1$, namely $A_1^{-1}$, needs to be computed in order to obtain $h_1$:

$$h = A_1^{-1} \cdot XZ$$

where $$A_1 \cdot A_1^{-1} = I \qquad \text{Equation 19}$$

where I is an N×N identity matrix.

Typically, computing the inverse of an N×N matrix is complex and requires significant computing resources especially when N is large. Several other well known methods have been developed to reduce the complexity of this computation. Examples of such methods include QR substitution, Cholesky decomposition, LU decomposition, Gauss-Jordan elimination, amongst others. Any suitable method for solving a set of linear equations may be used by the linear solver unit 560 to derive the vector $h_1$ including the set of filter coefficients. For more information regarding methods for solving sets of linear equations, the reader is invited to refer to "Numerical Recipes in C: The Art of Scientific Computing", William H. Press et al., Cambridge University Press (Chapter 2). The contents of this document are hereby incorporated by reference.

In a specific non-limiting example of implementation, the linear solver unit 560 makes use of the symmetric and positive definite characteristic of matrix $A_1$ by using Cholesky decomposition to solve the set of linear equations described by equation 18. Conceptually, the specific non-limiting example of implementation the linear solver unit 560 solves for the following:

$$A_1 h_1 = XZ \qquad \text{Equation 20}$$

As shown in FIG. 5, the linear solver unit 560 includes a Cholesky decomposition unit 502, a triangular matrix inverter 504, a triangular matrix transpose inverter 505 and a matrix multiplier and solver 506. The Cholesky decomposition unit 502 processes matrix $A_1$ to generate a lower triangular matrix W such that:

$$A = W \cdot W^{Transpose} \qquad \text{Equation 21}$$

Following this, the triangular matrix inverter 504 and the triangular matrix transpose inverter 505 process the lower triangular matrix W and its transpose respectively to generate the inverse of matrix W, namely $W^{-1}$, and the inverse of the transpose, namely $W^{Transpose-1}$. Although the linear solver unit 560 depicted in FIG. 5 includes a triangular matrix inverter 504 and triangular matrix transpose inverter 505, these may be implemented by the same physical module without detracting from the spirit of the invention. In general, the inverse of lower triangular matrix W requires fewer computations to compute than that of matrix $A_1$.

The matrix multiplier and solver unit 506 then solves the set of linear equations by substitution to obtain the set of filter coefficients in vector $h_1$. The matrix multiplier and solver 506 receives $W^{-1}$ and solves for a vector y:

solving for y $$y = W^{-1} XZ \qquad \text{Equation 22}$$

The matrix multiplier and solver 506 also receives $W^{Transpose-1}$ and uses solution to equation 22 to solve for $h_1$ as follows:

solving for h $$h_1 = W^{Transpose-1} y \qquad \text{Equation 23}$$

Vector $h_1$ is then released at the output forming a signal including a set of N filter coefficients Hnew 206. It is to be appreciated that other methods and implementations for solving a set of linear equations using Cholesky decomposition are possible without detracting from the spirit of the invention. For example, although the implementation depicted in FIG. 5 makes use of triangular matrix inverter/triangular matrix transpose inverter units 504, 505, direct solving of the following linear equations:

$$Wy = AZ \qquad \text{Equation 24}$$

and $$W^{Tranpose} h_1 = y \qquad \text{Equation 25}$$

can be done as well to derive vector $h_1$.

The generated set of filter coefficients Hnew 206 is then released at the output 356 of the coefficient generation unit 200.

Performance Evaluation Unit 202

In accordance with a specific implementation, the performance evaluation unit 202 characterizes the error function associated with adaptive filter 170 on the basis of the knowledge of the amplitude of the first signal Z 102 and of an estimate of the amplitude of the forward signal Y 106.

Theoretical Explanation

As was described previously, the error function can be expressed by equation 15 reproduced below:

$$E[z_k z_k^T]_t \underline{\text{error\_function}}^* = E[y_k z_k]_t.$$ 
Equation 15

In order to characterize the error function of the adaptive filter 170, a single tap filter is considered. In a single point tap system where $E[z_i z_i^T]_t$ has a single data element and $E[y_i z_i]_t$ has a single data element, equation 15 can be written as follows:

$$\sum_{i=0}^{t-1} z_i z_{i_t} \underline{\text{error\_function}} = \sum_{i=0}^{t-1} z_i y_i.$$
Equation 26

Solving for the error function at time t we obtain:

$$\text{error\_function}(t) = \frac{\sum_{i=0}^{t-1} z_i y_i}{\sum_{i=0}^{t-1} z_i z_i}$$
Equation 27 where t is the current sample time;

$z_k$ is a sample of the return signal Z 102 at time k; and $y_k$ is a sample of the return signal Y 106 at time k;

For the purpose of deriving a mathematical model to characterize the error function, an assumption is made that signal Z 102 and signal Y 106 are substantially independent of one another and are white. For the purpose of this specification, a signal S is white if $E(S_i S_j) \approx 0$ for $i \neq j$ and signals S and Q are independent if $E(S_i Q_j) \approx 0$ for all i,j. The above assumptions allow considering that the error added by each sample pair is an independent variable which can be described by the following expression:

$$\text{error}_k = \frac{z_k y_k}{z_k z_k}$$
Equation 28 where $z_k$ and $y_k$ are the kth samples of signals Z 102 and Y 106 respectively and $\text{error}_k$ is the kth component of the error function due to the kth samples of signals Z 102 and Y 106. The error function can be considered as the sum of the errors added by the samples. In statistics, the above described error function can be considered to be a random variable. In order to characterize this random variable, the mean and the variance (or alternatively the standard deviation) can be computed. Since signal Z 102 and signal Y 106 are assumed to be independent, the mean of this random variable is 0 and it will be shown below that the standard deviation can be given by:

$$\sigma_t = \frac{\left(\sum_{i=0}^{t-1}(z_i y_i)^2\right)^{\frac{1}{2}}}{\left[\left(\sum_{i=0}^{t-1} z_i z_i\right)^2 - \left(\sum_{i=0}^{t-1}(z_i z_i)^2\right)\right]^{\frac{1}{2}}}$$
Equation 29

Deriving the Standard Deviation Equation

The error inserted at each pair of samples $\{z_i, y_i\}$ can be represented mathematically by the following:

$$\text{error} = \frac{z_i y_i}{z_i z_i}$$
Equation 30

If the error components inserted at each pair of samples are equal to one another an are assigned equal weight, standard deviation of the error function after t samples can be expressed by the following expression:

$$\sigma_t = \frac{\text{error}}{\sqrt{t}} \quad \text{where } t \text{ is the number of samples and } \textit{error} \text{ is the error per sample}$$
Equation 31

When each sample has an error that is different from the other and has a different weight, the standard deviation of the error function can be expressed as the division of two terms namely the average error over time and the number of samples conditioned by the weight. The average standard deviation of the error function can be expressed as follows:

$$\sigma_A = \frac{\left(\sum_{i=0}^{t-1}(\text{error}_i * w_i)^2\right)^{\frac{1}{2}}}{\left(\sum_{i=0}^{t-1} w_i^2\right)^{\frac{1}{2}}}$$
Equation 32 where $w_i$ is a weight value associated to a given error component. The square root of the number of samples conditioned by the weight, which corresponds to $\sqrt{t}$ of Equation 31, can be given by:

$$\text{Sample number} = \frac{\sum_{i=0}^{t-1} w_i}{\left(\sum_{i=0}^{t-1} w_i^2\right)^{\frac{1}{2}}}$$
Equation 33

Therefore the standard deviation computation can be reduced to the following expression:

$$\sigma_t = \frac{\left(\sum_{i=0}^{t-1}(\text{error}_i * w_i)^2\right)^{\frac{1}{2}}}{\sum_{i=0}^{t-1} w_i}$$
Equation 34

In a least squares context, the weight $w_k$ of the error for each sample k is $z_k z_k$. Therefore, in the current specific example, the standard deviation of the error function can be expressed as follows:

$$\sigma_t = \frac{\left(\sum_{i=0}^{t-1}\left(\frac{z_i y_i}{z_i z_i} * z_i z_i\right)^2\right)^{\frac{1}{2}}}{\sum_{i=0}^{t-1} z_i z_i}$$
Equation 35 which can be reduced to the following:

$$\sigma_t = \frac{\left(\sum_{i=0}^{t-1}(z_i y_i)^2\right)^{\frac{1}{2}}}{\sum_{i=0}^{t-1} z_i z_i} \quad \text{Equation 36}$$

In statistics, it is well known that when an unbiased estimator of the variance (or standard deviation) of a set of sample is to be obtained, the sample number is reduced by "1" to obtain an unbiased effective sample set. The effective sample set can be expressed by:

$$\textit{Effective Sample number} = \left[\frac{\left(\sum_{i=0}^{t-1} w_i\right)^2}{\left(\sum_{i=0}^{t-1} w_i^2\right)} - 1\right]^{\frac{1}{2}} \quad \text{Equation 37}$$

Therefore the standard deviation computation can be reduced as follows:

$$\sigma_t = \frac{\left(\sum_{i=0}^{t-1}(error_i * w_i)^2\right)^{\frac{1}{2}}}{\left(\sum_{i=0}^{t-1} w_i^2\right)^{\frac{1}{2}}} * \frac{1}{\left[\frac{\left(\sum_{i=0}^{t-1} w_i\right)^2}{\left(\sum_{i=0}^{t-1} w_i^2\right)} - 1\right]^{\frac{1}{2}}} \quad \text{Equation 38}$$

$$\sigma_t = \frac{\left(\sum_{i=0}^{t-1}(error_i * w_i)^2\right)^{\frac{1}{2}}}{\left(\sum_{i=0}^{t-1} w_i^2\right)^{\frac{1}{2}}} * \frac{\left(\sum_{i=0}^{t-1} w_i^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \quad \text{Equation 39}$$

$$\sigma_t = \frac{\left(\sum_{i=0}^{t-1}(error_i * w_i)^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \quad \text{Equation 40}$$

In a least square context, the weight $w_k$ of the error for each sample k is $z_k z_k$. Therefore, in this second specific example, the standard deviation of the error function can be expressed as follows:

$$\sigma_t = \frac{\left(\sum_{i=0}^{t-1}(z_i y_i)^2\right)^{\frac{1}{2}}}{\left[\left(\sum_{i=0}^{t-1} z_i z_i\right)^2 - \left(\sum_{i=0}^{t-1}(z_i z_i)^2\right)\right]^{\frac{1}{2}}} \quad \text{Equation 41}$$

For the purpose of a specific implementation, equation 41 is used to characterize the standard deviation of the error function.

Adjustments for the Assumptions

As previously indicated, the above computations are based on the assumption that signals Z 102 and Y 106 are white and independent. The assumption that signal Z 102 and signal Y 106 are independent is reasonable for many applications of adaptive filtering. It will be readily appreciated that when signal Z 102 and signal Y 106 are not exactly independent, the computations described in this specification may nevertheless be used with the knowledge that certain errors factors may be introduced by this approximation.

However, the assumption that signals Z 102 and Y 106 are white is not true in most applications. In order to solve this problem, signals Z 102 and Y 106 are divided spectrally into a set of frequency bands, where signal Z 102 and Y 106 can be considered to generally be substantially white within a given frequency band. In the non-limiting example of implementation of an echo cancellor, the signals Z 102 and Y 106 (assuming a sampling rate of 8000 samples/sec and therefore a frequency spectrum from 0–4000 Hz) are divided into 257 frequency bands of 15.625 Hz each. Using heuristics measurements, this width has been found to be narrow enough that voice is approximately a white signal across each of the 15.625 Hz bands. The width of the bands may vary from one application to another without detracting from the spirit of the invention. The "whiteness" of the signal is a subjective quality and depends on the nature of the signals being processed. The error function is then characterized for each frequency band independently using the above described computation to estimate the mean (which is 0) and the standard deviation. For each frequency band, the standard deviation of the error function can be computed as follows:

$$\sigma_t[j] = \frac{\left(\sum_{i=0}^{t-1}(z_i[j]y_i[j])^2\right)^{\frac{1}{2}}}{\sum_{i=0}^{t-1} z_i[j]z_i[j]} \quad \text{Equation 42}$$

where z[j] and y[j] is the amplitude of the component of signal Z 102 and signal Y 106 respectively in frequency band j and $\sigma_t[j]$ is the standard deviation of the error function in frequency band j at time t.

Another assumption in the above computations is that the amplitude (or energy) of signal Y 106 is known. However, signal Y 106 is unknown since, if signal Y 106 were known, the adaptive filter 170 would serve no practical purpose. The amplitude of signal Y 106 can be approximated by the amplitude of signal Y* 108. More specifically, in a least squares system, the forward signal Y 106 can be considered as made up of two (2) components, namely a first component Yc which is correlated with signal Z 102 and a second component Yu which is uncorrelated with signal Z 102. Because, by definition, Yc and Yu are uncorrelated, the energy of forward signal Y 106 is equal to the sum of the energies of Yc and Yu. Mathematically, this can be expressed as follows:

$$Y\text{energy} = Yc \text{ energy} + Yu \text{ energy} \quad \text{Equation 43}$$

The filter 110 in combination with adder 180 will generally eliminate most of signal Yc. Therefore, the energy of signal Y* 108 will be essentially equal to the energy of Yu which is less than or equal to the energy of signal Y 106. Therefore, since signal Y 106 is not available, the energy of signal Y* 108 is used as an approximation of the energy of signal Y 106. For each frequency band, the standard deviation of the error function using Y* 108 can be computed as follows:

$$\sigma_t[j] = \frac{\left(\sum_{i=0}^{t-1}(z_i[j]y_i^*[j])^2\right)^{\frac{1}{2}}}{\left[\left(\sum_{i=0}^{t-1}z_i[j]z_i[j]\right)^2 - \left(\sum_{i=0}^{t-1}(z_i[j]z_i[j])^2\right)\right]^{\frac{1}{2}}} \quad \text{Equation 44}$$

Finally, although the above described standard deviation computations have been derived for an adaptive system having a single tap filter, similar derivations may be effected for a filter having N taps. In a practical application, for a filter having N taps, the standard deviation computation becomes:

$$\sigma_i[j] = \frac{\left(\sum_{i=0}^{\frac{t}{N}-1}(z_{N^*i}[j]y_{N^*i}^*[j])^2\right)^{\frac{1}{2}}}{\left[\left(\sum_{i=0}^{\frac{t}{N}-1}z_{N^*i}[j]z_{N^*i}[j]\right)^2 - \left(\sum_{i=0}^{\frac{t}{N}-1}(z_{N^*i}[j]z_{N^*i}[j])^2\right)\right]^{\frac{1}{2}}} \quad \text{Equation 45}$$

In view of the above description, deriving a standard deviation computation for N>1 will be readily apparent to the person skilled in the art and as such will not be described further.

Specific Implementation

As depicted in FIG. 2, the performance evaluation unit 202 receives the first signal Z 102, the second signal X 104 and the new set of filter coefficients Hnew 206 from the coefficient generation unit 200. The performance evaluation unit 202 is operative to generate at least in part on the basis of the first signal Z 102 and the second signal X 104 a set of performance data elements Herror 208 associated to the new set of filter coefficients Hnew 206. The performance evaluation unit 202 characterizes the error on a per-frequency band basis. Each performance data element in Herror 208 is a statistical estimate of the error function standard deviation for a respective frequency band.

Figure 8:
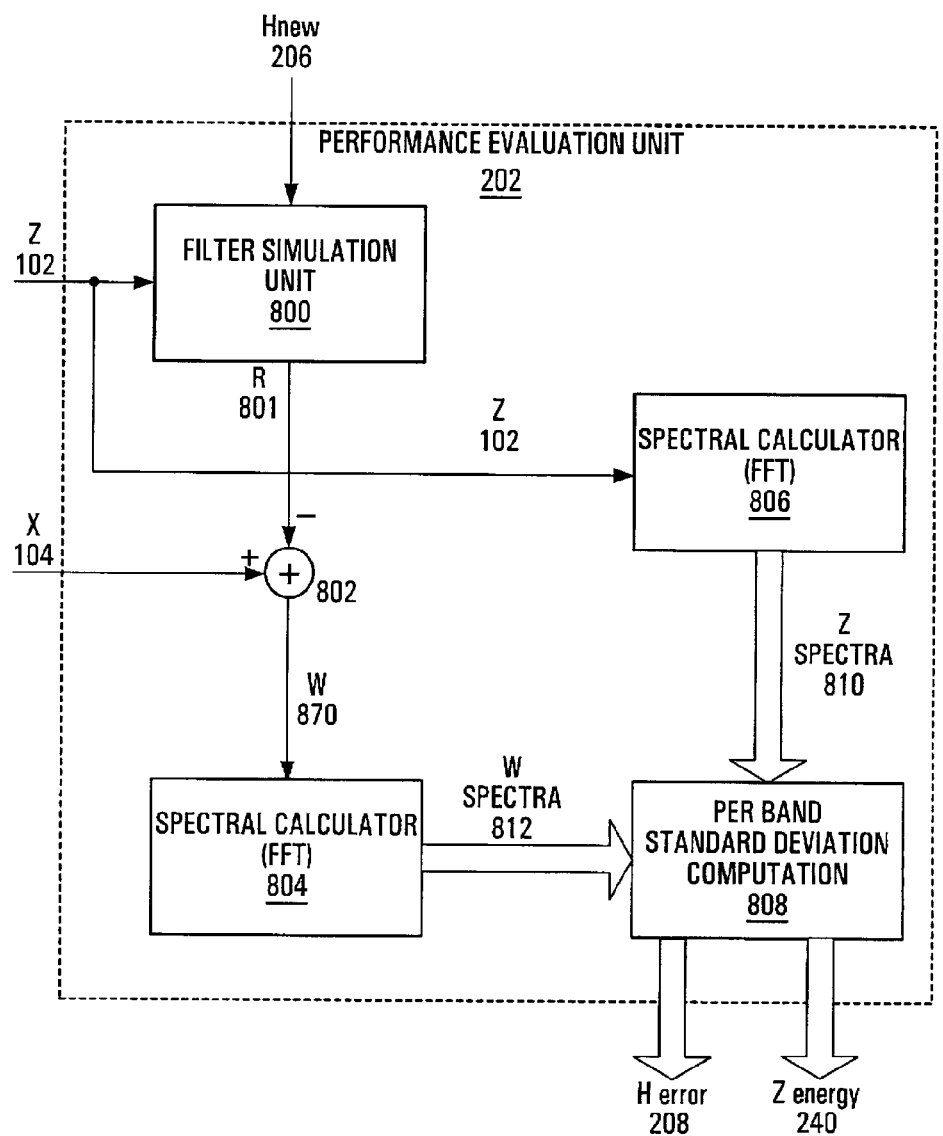
FIG. 8 is a functional block diagram of a performance evaluation unit suitable for use in the filter adaptation unit of FIG. 2 in accordance with a non-limiting example of implementation of the invention.

FIG. 8 shows a specific example of implementation of the performance evaluation unit 202 including a filter simulation unit 800, an adder unit 802, a first spectral calculator 806, a second spectral calculator 804 and a per-band standard deviation computation unit 808.

The filter simulation unit 800 is suitably embodied as an adaptive digital filter and simulates the processing of filter 110 shown in FIG. 1. The filter simulation unit 800 taps the return signal Z 102, and receives the new set of filter coefficients Hnew 206 from the coefficient generation unit 200. The filter simulation unit 800 applies a filtering operation corresponding to the filter coefficients Hnew 206 to the return signal Z 102 to produce filtered signal R 801. The manner in which the filtering operative is applied was described with regard to filter 110 in FIG. 1 and therefore will not be repeated here.

The output of the filter simulation unit 800, namely the filtered signal R 801, is subtracted by adder unit 802 on a sample-by-sample basis from the corrupted forward signal X 104 to yield a signal denoted W 870. Signal W 870 is an estimate of signal Y 106 (FIG. 1) generated on the basis of the set of filter coefficients Hnew 206.

First spectral calculator 806 taps first signal Z 102 and divides the signal into a set of frequency bands. In a non-limiting example, the first spectral calculator 806 processes a set of samples of signal Z 102 from which the set of filter coefficients Hnew 206 was generated, where the first sample of the set of samples was taken at time t=1. The first spectral calculator 806 applies a set of Fast Fourier Transform (FFT) of length (K−1)*2, each Fast Fourier Transform (FFT) being applied to N of the samples of signal Z 102, where N is the number of taps of the adaptive filter 170. The computation of an FFT is well known in the art to which this invention pertains and as such will not be described further herein. For a given time t, the above calculation results into t/N sets of K spectral values of signal Z 102, each spectral value being associated to a respective frequency band from a set of K frequency bands. In a non-limiting example used in echo cancellation, K=257 is used to divide the frequency spectrum of signal Z 102 into 257 frequency bands. If the frequency spectrum goes from 0 Hz to 4000 Hz (assuming a sampling rate of 8000 Hz), then there will be frequency bands centered at 0 Hz, 15.625 Hz, 15.625*2 Hz, 15.625*3 Hz, [ . . . ] and 4000 Hz. Mathematically, this can be expressed as follows:

$$Z_{SPECTRA} = FFT(z(t)) \quad \text{Equation 46}$$

$$= \begin{bmatrix} Z_{SPECTRA}(0) \\ Z_{SPECTRA}(1) \\ Z_{SPECTRA}(2) \\ \cdots \\ Z_{SPECTRA}(K-2) \\ Z_{SPECTRA}(K-1) \end{bmatrix}_0 \begin{bmatrix} Z_{SPECTRA}(0) \\ Z_{SPECTRA}(1) \\ Z_{SPECTRA}(2) \\ \cdots \\ Z_{SPECTRA}(K-2) \\ Z_{SPECTRA}(K-1) \end{bmatrix}_1$$

$$\cdots \begin{bmatrix} Z_{SPECTRA}(0) \\ Z_{SPECTRA}(1) \\ Z_{SPECTRA}(2) \\ \cdots \\ Z_{SPECTRA}(K-2) \\ Z_{SPECTRA}(K-1) \end{bmatrix}_{\frac{t}{N}-1} \quad \text{where}$$

$$Z_{j,SPECTRA} = \begin{bmatrix} Z_{SPECTRA}(0) \\ Z_{SPECTRA}(1) \\ Z_{SPECTRA}(2) \\ \cdots \\ Z_{SPECTRA}(K-2) \\ Z_{SPECTRA}(K-1) \end{bmatrix}_j$$

where $Z_{SPECTRA}$ is a data structure of t/N vectors each of size K, each vector being indicative of a spectral representation of N samples of signal z(t) and $Z_{SPECTRA}$ (j) is the spectral value of signal Z 102 associated to frequency band j. $Z_{SPECTRA}$ 810 is released by the second spectral calculator 804.

Second spectral calculator 804 taps the signal W 870 and divides the signal into a set of K frequency bands. In a non-limiting example, the second spectral calculator 804 processes a set of samples of signal W 870 corresponding to the set of samples of Z 102 processed by first spectral calculator 806, where the first sample of the set of samples of signal W 870 was taken at time t=1. The first spectral calculator 806 applies a set of Fast Fourier Transform (FFT) of length (K−1)*2, each Fast Fourier Transform (FFT) being applied to N of the samples of signal W 870 where N is the number of taps of the adaptive filter 170. The computation of an FFT is well known in the art to which this invention pertains and as such will not be described further herein. For a given time t, the above calculation results into t/N sets of K spectral values of signal W 870, each spectral value being associated to a respective frequency band from a set of K frequency bands. Mathematically, this can be expressed as follows:

$$W_{SPECTRA} = FFT(z(t)) \quad \text{Equation 47}$$

$$= \begin{bmatrix} \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_0 \\ \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_1 \\ \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_{\frac{t}{N}-1} \end{bmatrix} \quad \text{where}$$

$$W_{j,SPECTRA} = \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_j$$

where $W_{SPECTRA}$ is a data structure of t/N vectors each of size K, each vector being indicative of a spectral representation of N samples signal W 870 and $W_{SPECTRA}$ (j) is the spectral value of signal W 870 associated to frequency band j. $W_{SPECTRA}$ 812 is released by the second spectral calculator 804.

Methods other than the FFT for dividing a signal into a set of frequency bands may be used by the spectral calculators 804, 806, such as for example a cosine transform and other similar transforms. Although first spectral calculator 806 and second spectral calculator 804 are depicted as separate components in FIG. 8, it will be readily appreciated that they may be embodied in a same physical device and may share functional components without detracting from the spirit of the invention.

The per-band standard deviation computation unit 808 receives $W_{SPECTRA}$ 812 and $Z_{SPECTRA}$ 810 and processes each frequency band to generate an error characterization estimate Herror[j] for each band j, for j=0 . . . K−1. In a specific implementation, Herror[j] is the standard deviation of error function for frequency band j. The per-band standard deviation computation unit 808 also generates a per-band energy estimate for signal Z 102, identified as Zenergy 240 in FIG. 8.

Figure 9:
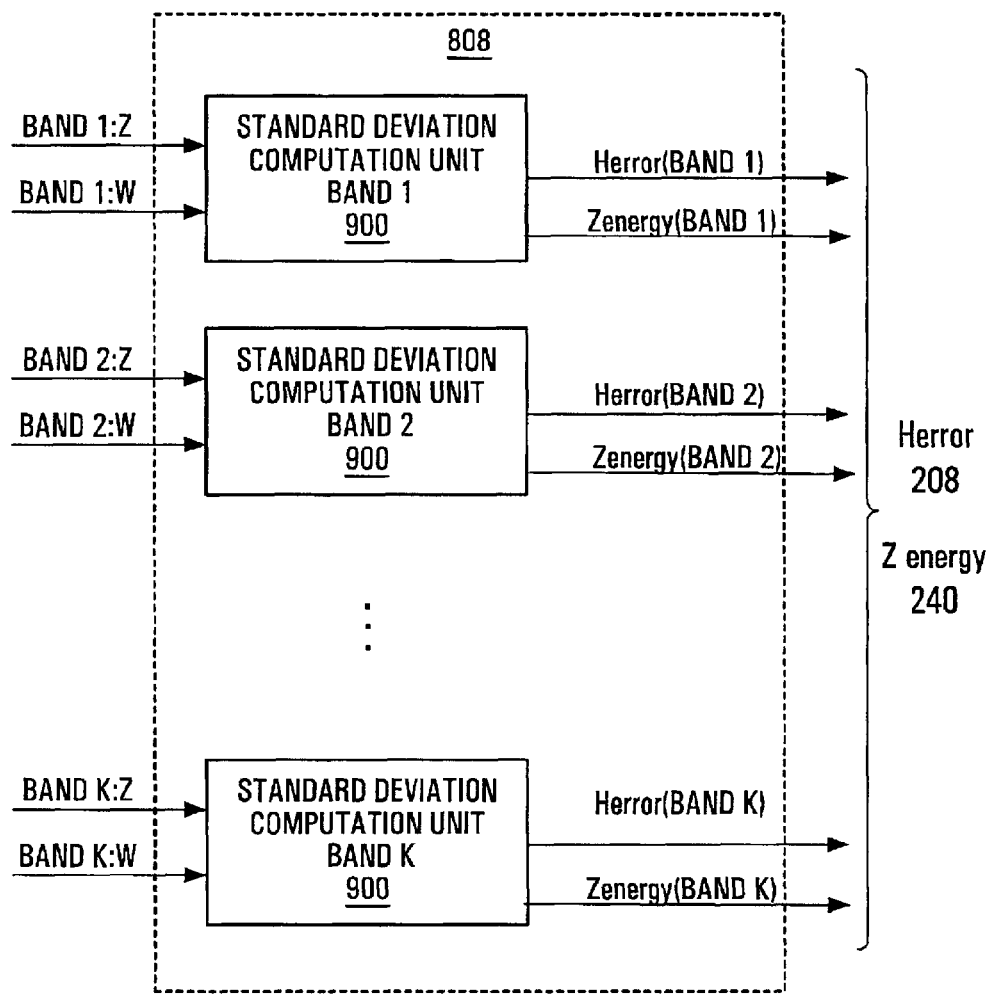
FIG. 9 is a functional block diagram of a standard deviation computation unit suitable for use in the performance evaluation unit of FIG. 8 in accordance with a non-limiting example of implementation.

FIG. 9 shows a conceptual block diagram of the per-band standard deviation computation unit 808. As depicted, the per-band standard deviation computation unit 808 includes a set of K parallel computation units 900 where each unit 900 is operative to compute the standard deviation of the error function for a respective frequency band. If the frequency bands are narrow, the signals Z 102 and W 870 can be considered "white" within a frequency band thereby allowing the following computation to be used:

$$\text{for } j = 0 \ldots K-1. \quad \text{Equation 48}$$

$$H_{error}[j] = \frac{\sum_{i=0}^{\frac{t}{N}-1} ((W_{i,SPECTRA}[j] \times Z_{i,SPECTRA}[j])^2)^{\frac{1}{2}}}{\left[ \left( \sum_{i=0}^{\frac{t}{N}-1} Z_{i,SPECTRA}[j] \times Z_{i,SPECTRA}[j] \right)^2 - \left( \sum_{i=0}^{\frac{t}{N}-1} (Z_{i,SPECTRA}[j] \times Z_{i,SPECTRA}[j])^2 \right) \right]^{\frac{1}{2}}}$$

where Herror[j] is the performance data element for frequency band j and Herror 208 is a set of K performance data elements. Each unit 900 also releases a data element Zenergy[j] indicative of the energy of signal Z 102 in frequency band j and Zenergy 240 is a set of K energy data elements. Zenergy is computed as follows:

$$Z_{energy}[j] = \sum_{i=0}^{\frac{t}{N}-1} (Z_{i,SPECTRA}[j] \times Z_{i,SPECTRA}[j]) \quad \text{Equation 49}$$

for $j = 0 \ldots K-1$

The skilled person in the art will readily appreciate that the implementation depicted in FIG. 8 is for the purpose of example only as many other implementations are possible.

Although the above described specific examples of implementations show the computations in the frequency domain of the auto-correlation of signal Z 102 and the cross-correlation of signals Z 102 and W 870, it is to be understood that the equivalent of either of these computations may be effected in the time domain without detracting from the spirit of the invention. For example, the auto-correlation and cross-correlation computations may be effected in the time domain and, subsequently, the auto-correlation divided spectrally in order to effect the computation of the standard deviation in the frequency domain.

Figure 10:
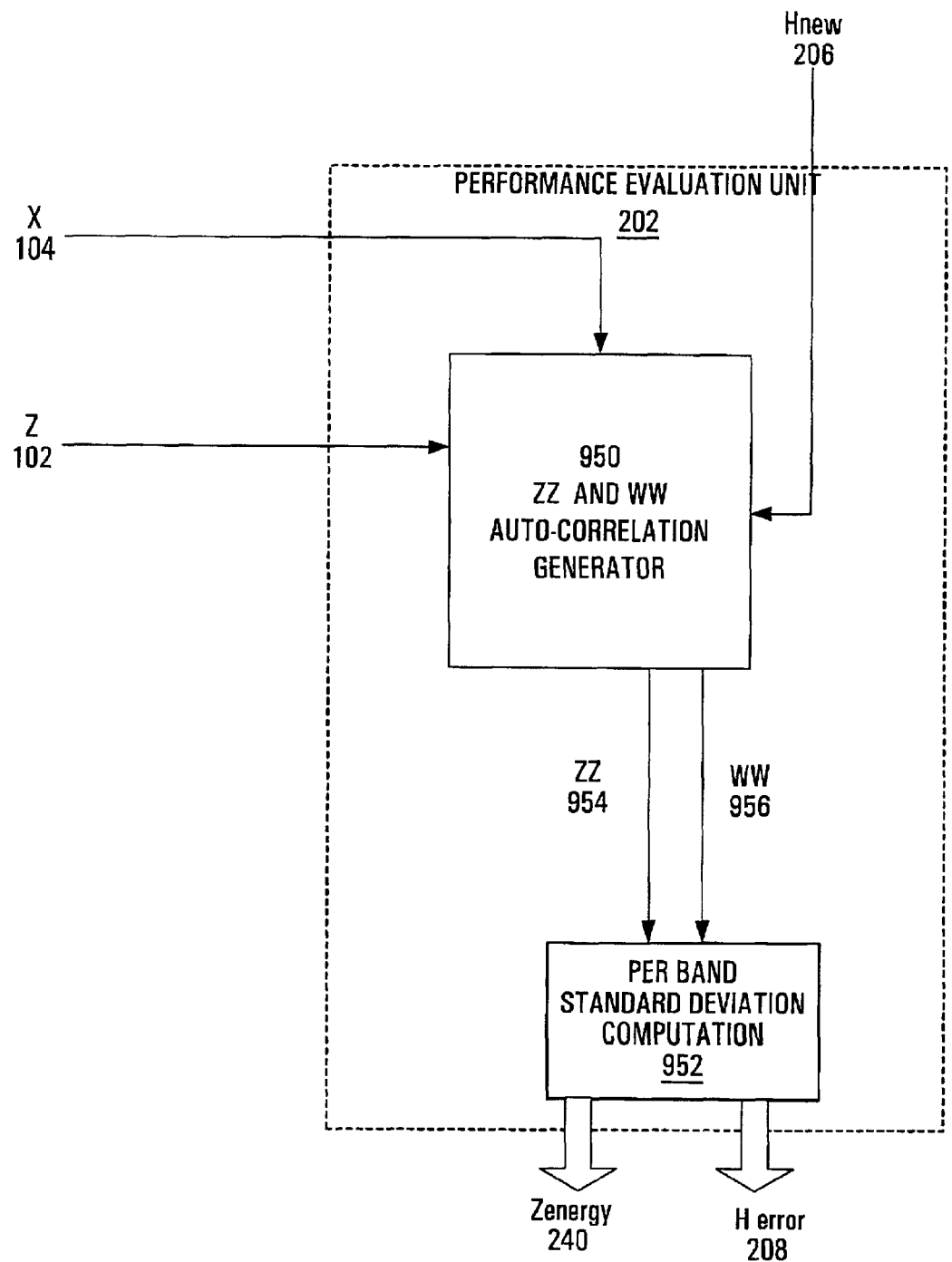
FIG. 10 is a flow diagram showing a process for generating a set of performance data elements in accordance with a specific example of implementation of the invention.

FIG. 10 shows an alternative non-limiting implementation of the performance evaluation unit 202 including a ZZ and WW auto-correlation generator 950 and a per-band standard deviation computation unit 952. It can be noted that Herror can be expressed as follows:

$$\text{For } j = 0 \ldots K-1 \quad \text{Equation 50}$$

$$H_{error}[j] = \frac{\sum_{i=0}^{\frac{t}{N}-1} \left( \left( \frac{W_{i,SPECTRA}[j] \times W_{i,SPECTRA}[j] \times}{Z_{i,SPECTRA}[j] \times Z_{i,SPECTRA}[j]} \right) \right)^{\frac{1}{2}}}{\left[ \left( \sum_{i=0}^{\frac{t}{N}-1} Z_{i,SPECTRA}[j] \times Z_{i,SPECTRA}[j] \right)^2 - \left( \sum_{i=0}^{\frac{t}{N}-1} (Z_{i,SPECTRA}[j] \times Z_{i,SPECTRA}[j])^2 \right) \right]^{\frac{1}{2}}}$$

Note that $W_{t,SPECTRA}[j] \times W_{t,SPECTRA}[j]$ is the $i^{th}$ component of the auto-correlation of signal W 470 in frequency band j. Note that:

$$(W_{i,SPECTRA}[j] \times W_{i,SPECTRA}[j]) = \quad \text{Equation 51}$$

$$(X_{i,SPECTRA}[j] - Z_{i,SPECTRA}[j] \otimes h(t))^2 =$$

$$X_{i,SPECTRA}[j] \times X_{i,SPECTRA}[j] -$$

$$2X_{i,SPECTRA}[j]Z_{i,SPECTRA}[j] \otimes h(t) +$$

$$Z_{i,SPECTRA}[j] \times Z_{i,SPECTRA}[j] \times$$

$$Z_{i,SPECTRA}[j] \times Z_{i,SPECTRA}[j] \otimes h(t) \otimes h(t)$$

where $\otimes$ denotes a convolution operation. As can be seen from the above equation, the auto-correlation of signal W 870 can be obtained from the auto-correlation of signal X 104, the auto-correlation of signal Z 102 and the cross-correlation of signal Z 102 with signal X 104.

The ZZ and WW auto-correlation generator 950 is operative to generate a sequence of $W_{t,SPECTRA}[j] \times W_{t,SPECTRA}[j]$ auto-correlation data elements, shown as WW 956 in FIG. 10, on the basis of the relationship described in equation 38 above and a sequence of $Z_{t,SPECTRA}[j] \times Z_{t,SPECTRA}[j]$ auto-correlation data elements, shown as ZZ 954 in FIG. 10. The ZZ and WW auto-correlation generator 950 may be implemented in a number of ways and the specific implementation is not a limiting element of the invention and will not be described in further detail herein as it will be readily apparent to the person skilled in the art.

The per-band standard deviation computation unit 952 receives a sequence of $W_{t,SPECTRA}[j] \times W_{t,SPECTRA}[j]$ auto-correlation data elements 956 and a sequence of $Z_{t,SPECTRA}[j] \times Z_{t,SPECTRA}[j]$ 954 and computes Herror[j] for j=0 . . . K−1 using the following relationship:

$$H_{error}[j] = \frac{\sum_{i=0}^{\frac{t}{N}-1}\left(\left(\frac{W_{i,SPECTRA}[j] \times W_{i,SPECTRA}[j] \times}{Z_{i,SPECTRA}[j] \times Z_{i,SPECTRA}[j]}\right)\right)^{\frac{1}{2}}}{\left[\left(\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right)\right]^{\frac{1}{2}}} \quad \text{Equation 52}$$

The per-band standard deviation computation unit 952 also releases a Zenergy 240 indicative of the per band energy of signal Z 102 computed as follows:

$$Z_{energy}[j] = \sum_{i=0}^{\frac{t}{N}-1}(Z_{i,SPECTRA}[j] \times Z_{i,SPECTRA}[j]) \quad \text{Equation 53}$$

$$\text{for } j = 0 \ldots K-1$$

Figure 11:
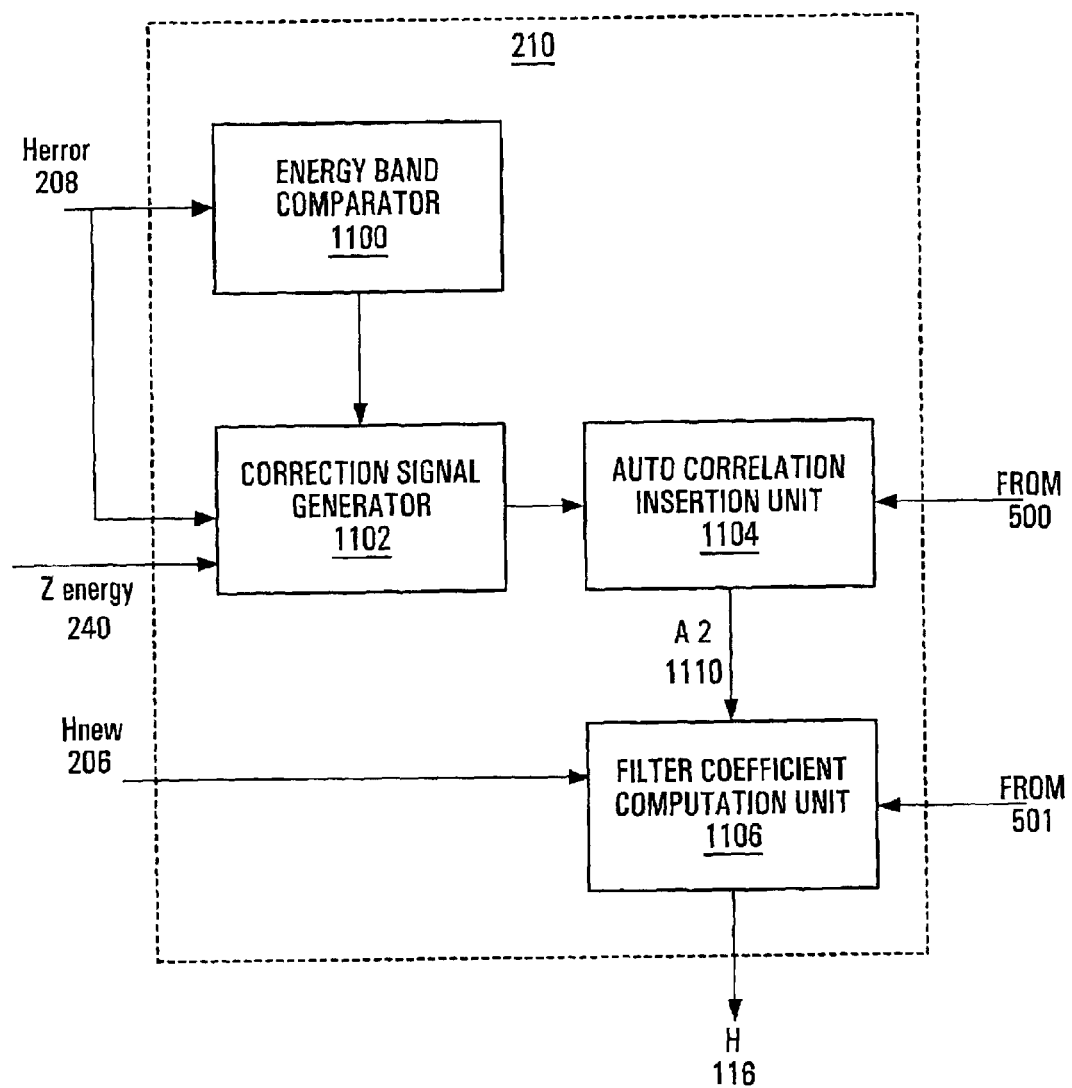
FIG. 11 is a functional block diagram of a noise reduction unit suitable for use in the filter adaptation unit of FIG. 2 in accordance with a non-limiting example of implementation of the invention.

Herror 208 and Zenergy 240 are released by the performance evaluation unit 202 and provided to the noise reduction unit 210 depicted in greater detail in FIG. 11.

Noise Reduction Unit 210

FIG. 11 shows a specific example of implementation of the noise reduction unit 210 including an energy band comparator 1100, a correction signal generator 1102, an auto-correlation insertion unit 1104 and a filter coefficient computation unit 1106.

The energy band comparator 1100 determines for each frequency band in the set of K frequency bands whether the performance of the first set of filter coefficients Hnew 206 is satisfactory or unsatisfactory for that frequency band. The energy band comparator receives Herror 208 including a set of the amplitude values represented by the standard deviation values for the set of frequency bands. In a non-limiting example, for each frequency band j, for j=0 . . . K−1, the energy band comparator 1100 performs the following comparison:

if Herror[j]>Ethreshold[j]

Performance[j]=unsatisfactory else Performance[j]=satisfactory   Equation 54 where Ethreshold[j] is indicative of an amplitude threshold value for frequency band j and Performance[j] is a performance indicator for frequency band j. The amplitude threshold may vary from one application to the other. In a non-limiting example of implementation, the threshold is selected based on the maximum amount of correlation that can be expected between the Z 102 and X 104 signals. If the error standard deviation value exceeds this amount then it can be deduced that the filter 110 may be added more correlation to signal X 104 than was initially present which is an undesirable behavior.

In the specific example where the adaptive filter 170 is used in an echo canceling system, a maximum value of 0.5 (−6 dB) is used as the threshold value for all frequencies. The amplitude threshold value may be the same across all frequency bands such that Ethreshold[j]=Ethreshold for all j=0 . . . K−1 or may be a different value without detracting from the spirit of the invention.

The correction signal generator 1102 receives the performance indicators from the energy band comparator 1100, the Herror 208 from the performance evaluation unit 202 and the Z energy value 240 and generates a correction signal for each frequency band associated to a performance indicator indicative of an unsatisfactory performance. In a non-limiting example, the energy of the correction signal is a function of the standard deviation of the error function and of the energy of signal Z 102 within the same frequency band. A specific example uses the following mathematical computation to determine the energy of the correction signal:

$$\text{for } j = 0 \ldots K-1 \quad \text{Equation 55}$$

if $Performance[j] = $ unsatisfactory then

Correction_signal[j] =

$$Zenergy[j] \times \frac{(Herror[j] - Ethreshold[j])}{Ethreshold[j]}$$

else Correction_signal[j] = 0 where a correction signal for band j has an energy correction_signal[j] computed by the above equation and energy in frequency band j. The term correction_signal[j], for j=0 . . . K−1, in the above equation is indicative of a set of K correction signals, where each correction signal is associated to a respective frequency band. In a specific example of implementation, each correction signal is a signal of energy correction_signal[j] and having its energy substantially within the frequency band for which it was generated. For the purpose of simplicity, corrections signal including a single frequency, are generated by the correction signal generator, where the frequency is within the corresponding frequency band.

In an alternative implementation, the functionality implemented by the energy band comparator 1100 and the correction signal generator 1102 may be combined into a single operation implemented by a single functional module. In this alternative implementation, the use of a Performance[j] data structure is omitted. The combined functionality may be described by the following:

$$\text{if } Herror[j] > Ethreshold[j] \text{ then} \quad \text{Equation 56}$$
$$\text{Correction\_signal}[j] =$$
$$Zenergy[j] \times \frac{(Herror[j] - Ethreshold[j])}{Ethreshold[j]}$$
$$\text{else Correction\_signal}[j] = 0$$

The auto-correlation insertion unit 1104 receives the set of correction signals from the correction signal generator 1102 as well as the auto-correlation matrix from the auto-correlation memory unit 500 (shown in FIG. 5), referred to as the initial auto-correlation matrix. The auto-correlation insertion unit 1104 is operative to modify the initial auto-correlation matrix on the basis of the set of correction signals received.

In a non-limiting implementation, for each correction signal in the set of correction signals, an auto-correlation is performed over N samples of the correction signal in order to generate an N×N auto-correlation matrix. This generates a set of auto-correlation matrices, one matrix for each correction signal in the set of the correction signals. Following this, a matrix addition is performed between the set of correlation matrices associated to the set of correction signals and the initial auto-correlation matrix $A_1$ obtained from the auto-correlation of signal Z 102. In the above fashion, a modified auto-correlation matrix $A_2$ 1110 is generated. Matrix $A_2$, as matrix $A_1$, is symmetric and positive definite.

The filter computation unit 1106 makes use of the modified correlation matrix $A_2$ 1110 and the cross-correlation data elements from the cross-correlation memory unit 501 (FIG. 5) and generates a second set of filter represented by a vector $h_2$.

The filter coefficient computation unit 1106 solves the following equation:

$$A_2 h_2 = B \quad \text{Equation 57}$$

There are many known methods that can be used to solve linear systems of the type described by the above equations. Examples of such methods include direct matrix inversion, QR substitution, Cholesky decomposition, LU decomposition, Gauss-Jordan elimination, amongst others. Any suitable method for solving a set of linear equations may be used to derive vector $h_2$, where vector $h_2$ includes the second set of filter coefficients. For more information regarding methods for solving sets of linear equations, the reader is invited to refer to "Numerical Recipes in C: The Art of Scientific Computing", William H. Press et al., Cambridge University Press (Chapter 2). The contents of this document are hereby incorporated by reference.

The new set of filter coefficients $h_2$ is released as signal H 116 at the output 356 of the coefficient adaptation unit 100 for use by filter 110.

It will be readily observed that when $A_2=A_1$, H 116 is the same as Hnew 206, processing by the filter coefficient computation unit 1106 can be bypassed.

Figure 12:
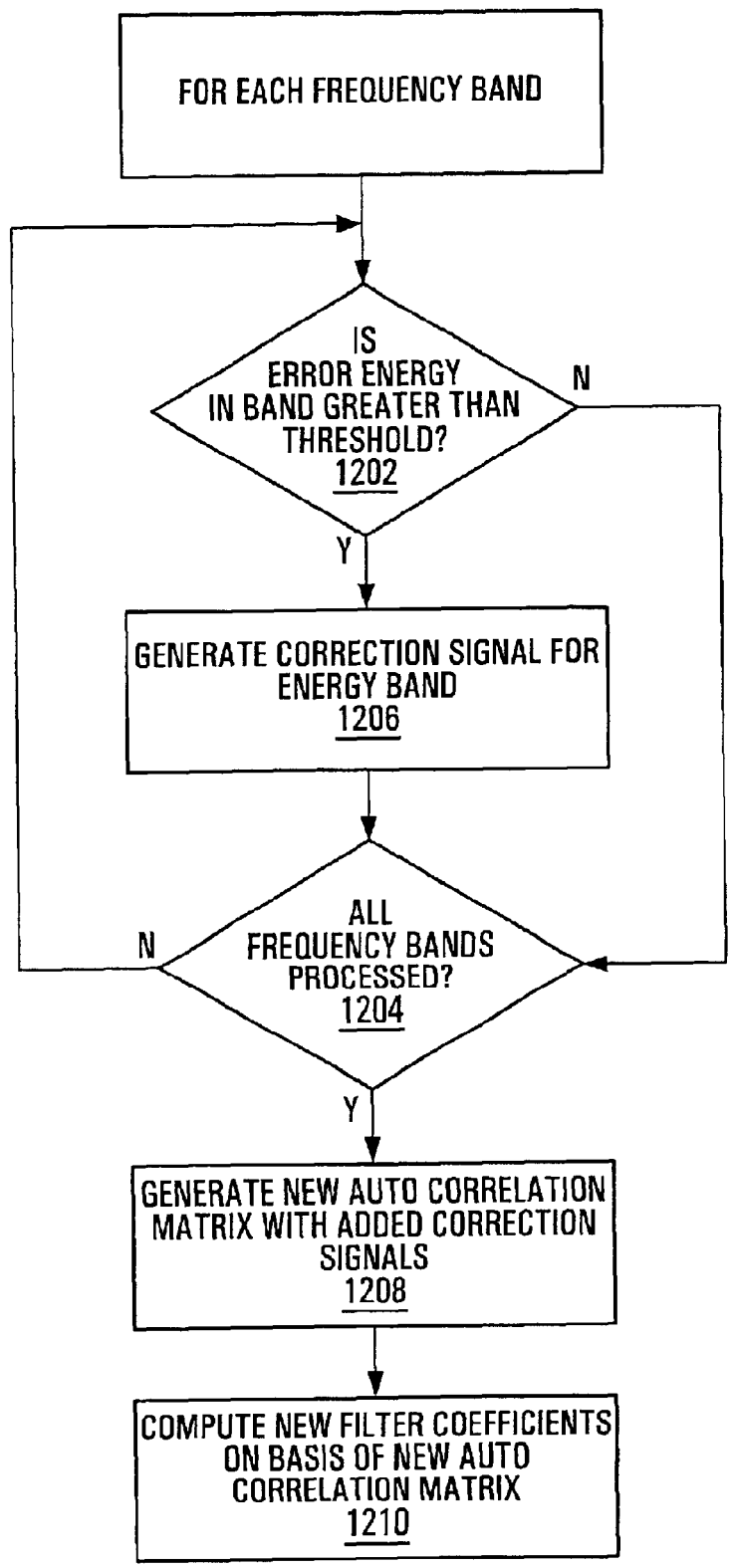
FIG. 12 is a flow diagram showing a process implemented by the noise reduction unit for generating a new set of filter coefficients in accordance with a specific example of implementation of the invention.

A typical interaction will better illustrate the functioning of the noise reduction unit 210. As shown in FIG. 12, at step 1202, for each frequency band in the set of K frequency bands, the error amplitude received in Herror 208 is compared to a threshold value for that frequency band. If the error amplitude for that frequency band exceeds the threshold value, at step 1206, a correction signal within that frequency band is generated. Following step 1206, or alternatively if condition 1202 is answered in the negative, the system verifies at condition 1204 whether all the frequency bands have been processed. If there are remaining unprocessed frequency bands, the system returns to step 1202. If all frequency bands have been processed, at step 1208 a modified auto-correlation matrix $A_2$ is generated on the basis of auto-correlation matrix $A_1$ and the set of correction signals generated at step 1206. At step 1210, a new set of filter coefficients H116 is computed on the basis of the modified auto-correlation matrix $A_2$.

Figure 13:
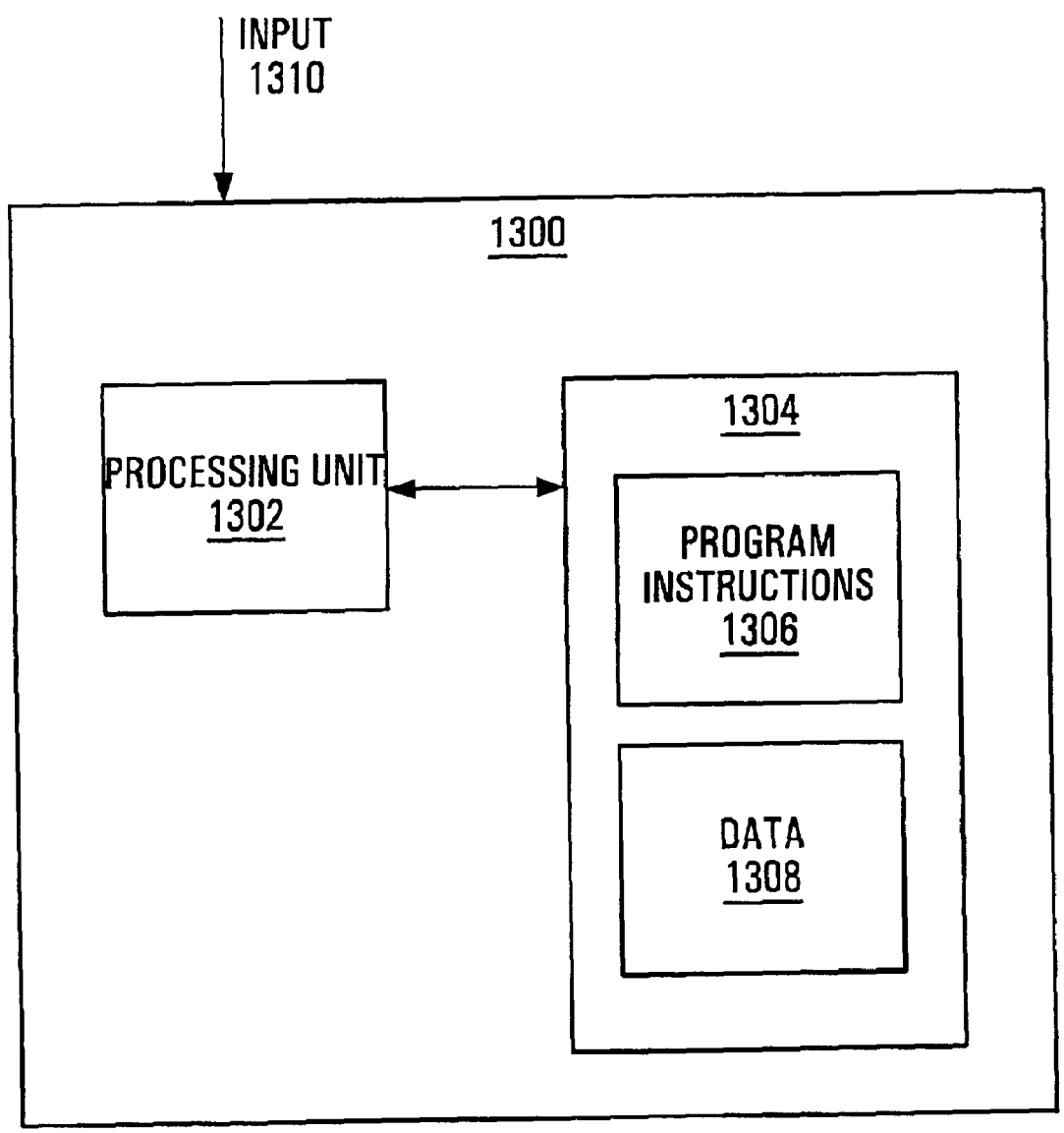
FIG. 13 is a block diagram of an apparatus for generating a set of filter coefficients in accordance with a specific example of implementation of the invention.

The above-described process for producing a set of filter coefficients can be implemented on a general purpose digital computer of the type depicted in FIG. 13, including a processing unit 1302 and a memory 1304 connected by a communication bus. The memory includes data 1308 and program instructions 1306. The processing unit 1302 is adapted to process the data 1308 and the program instructions 1306 in order to implement the functional blocks described in the specification and depicted in the drawings. The digital computer 1300 may also comprise an I/O interface for receiving or sending data elements to external devices. For example, the I/O interface may be used for receiving the first signal Z 102 and the second signal X 104.

Alternatively, the above-described process for producing a set of filter coefficients can be implemented on a dedicated hardware platform where electrical/optical components implement the functional blocks described in the specification and depicted in the drawings. Specific implementations may be realized using ICs, ASICs, DSPs, FPGA or other suitable hardware platform. It will be readily appreciated that the hardware platform is not a limiting component of the invention.

Although the present invention has been described in considerable detail with reference to certain preferred embodiments thereof, variations and refinements are possible without departing from the spirit of the invention. Therefore, the scope of the invention should be limited only by the appended claims and their equivalents.

What is claimed is:

1. A filter adaptation unit suitable for producing a set of filter coefficients, said filter adaptation unit comprising:
    a) a first input for receiving a sequence of samples of a first signal;
    b) a second input for receiving a sequence of samples of a second signal, the second signal including a certain component which is correlated to the first signal;
    c) a coefficient generation unit operative for generating a first set of filter coefficients at least in part on the basis of said first and second signals, the first set of filter coefficients being such that when the first set of filter coefficients is applied by a filter on the first signal, a first estimate of the certain component in the second signal is generated;
    d) a performance evaluation unit operative for generating a set of performance data elements for a filter using the first set of filter coefficients, each performance data element being associated to a respective frequency band selected from a set of frequency bands;
    e) a noise reduction unit operative for:
        i. generating a set of correction signals, said set of correction signal including a correction signal for each frequency band where the associated performance data element is indicative of an unsatisfactory performance;

ii. generating a second set of filter coefficients at least in part on the basis of:
(a) said first signal;
(b) said second signal; and
(c) the set of correction signals;
the second set of filter coefficients being such that when the second set of filter coefficients is applied by a filter on the first signal, a second estimate of the certain component in the second signal is generated;

f) an output for releasing a signal indicative of the second set of filter coefficients in a format suitable for use by a filter.

2. A filter adaptation unit as defined in claim 1, wherein a correction signal in the set of correction signals is indicative of a signal having its signal energy substantially within the frequency band for which it was generated.

3. A filter adaptation unit as defined in claim 1, wherein the performance data elements are indicative of error signal energy estimates for respective frequency bands selected from the set of frequency bands.

4. A filter adaptation unit as defined in claim 3, wherein a performance data element is indicative of an unsatisfactory performance if it is indicative of an error amplitude estimate that exceeds a certain threshold.

5. A filter adaptation unit as defined in claim 4, wherein the error amplitude estimate is indicative of a standard deviation estimate.

6. A filter adaptation unit as defined in claim 1, wherein said coefficient generation unit is operative for:

a) generating a first set of contextual information data elements at least in part on the basis of said first and second signals;

b) generating the first set of filter coefficient at least in part on the basis of the first set of contextual information data elements;

said noise reduction unit being operative for:
i. processing the first set of contextual information data elements at least in part on the basis of the set of correction signals to generate a modified set of contextual information data elements;
ii. processing the modified set of contextual information data elements to generate the second set of filter coefficients.

7. A filter adaptation unit as defined in claim 6, wherein said first set of contextual information data elements comprises:

a) a set of auto-correlation data elements for the sequence of samples of the first signal;

b) a set of cross-correlation data elements for the sequence of samples of the first signal and the sequence of samples of the second signal.

8. A filter adaptation unit as defined in claim 7, wherein said noise reduction unit is operative for modifying the set of auto-correlation data elements on the basis of said set of correction signals.

9. A filter adaptation unit as defined in claim 8, wherein said set of auto-correlation data elements forms a two-dimensional auto-correlation matrix data structure including a plurality of entries, said noise reduction unit being operative to modify the entries of the two-dimensional matrix data structure on the basis of said set of correction signals.

10. A filter adaptation unit as defined in claim 9, wherein said noise reduction unit is operative for:

a) applying a Cholesky decomposition method to the auto-correlation matrix data structure to derive a lower triangular matrix data structure and an upper triangular matrix data structure;

b) processing the lower triangular matrix data structure and the upper triangular matrix data structure on the basis of the set of cross-correlation data elements to derive the second set of filter coefficients.

11. A method suitable for producing a set of filter coefficients, said method comprising:

a) receiving a sequence of samples of a first signal;

b) receiving a sequence of samples of a second signal, the second signal including a certain component which is correlated to the first signal;

c) generating a first set of filter coefficients at least in part on the basis of said first and second signals, the first set of filter coefficients being such that when the first set of filter coefficients is applied by a filter on the first signal, a first estimate of the certain component in the second signal is generated;

d) generating a set of performance data elements for a filter using the first set of filter coefficients, each performance data element being associated to a respective frequency band selected from a set of frequency bands;

e) determining for each frequency band in the set of frequency bands if the associated performance data element is indicative of a satisfactory performance or an unsatisfactory performance;

f) generating a set of correction signals, said set of correction signal including a correction signal for each frequency band where the associated performance data element is indicative of an unsatisfactory performance;

g) generating a second set of filter coefficients at least in part on the basis of:
(a) said first signal;
(b) said second signal; and
(c) said set of correction signals;
the second set of filter coefficients being such that when the second set of filter coefficients is applied by a filter on the first signal, a second estimate of the certain component in the second signal is generated;

h) releasing a signal indicative of the second set of filter coefficients in a format suitable for use by a filter.

12. A method as defined in claim 11, wherein a correction signal in said set of correction signals is indicative of a signal having its signal energy substantially within the frequency band for which it was generated.

13. A method as defined in claim 11, wherein the performance data elements are indicative of error signal amplitude estimates for respective frequency bands selected from the set of frequency bands.

14. A method as defined in claim 13, wherein a performance data element is indicative of an unsatisfactory performance if it is indicative of an error amplitude estimate that exceeds a certain threshold.

15. A method as defined in claim 14, wherein the error amplitude estimate is indicative of a standard deviation estimate.

16. A method as defined in claim 11, wherein said method further comprises:

a) generating a first set of contextual information data elements at least in part on the basis of said first and second signals;

b) generating the first set of filter coefficient at least in part on the basis of the first set of contextual information data elements;

c) processing the first set of contextual information data elements at least in part on the basis of the set of correction signals to generate a modified set of contextual information data elements;

d) processing the modified set of contextual information data elements to generate the second set of filter coefficients.

17. A method as defined in claim 16, wherein said first set of contextual information data elements comprises:

a) a set of auto-correlation data elements for the sequence of samples of the first signal;

b) a set of cross-correlation data elements for the sequence of samples of the first signal and the sequence of samples of the second signal.

18. A method as defined in claim 17, wherein said method further comprises modifying the set of auto-correlation data elements on the basis of said set of correction signals.

19. A method as defined in claim 18, wherein said set of auto-correlation data elements forms a two-dimensional auto-correlation matrix data structure including a plurality of entries, said method comprising modifying the entries of the two-dimensional matrix data structure on the basis of said set of correction signals.

20. A method as defined in claim 19, wherein said method comprises:

a) applying a Cholesky decomposition method to the auto-correlation matrix data structure to derive a lower triangular matrix data structure and an upper triangular matrix data structure;

b) processing the lower triangular matrix data structure and the upper triangular matrix data structure on the basis of the set of cross-correlation data elements to derive the second set of filter coefficients.

21. A computer readable medium including a program element suitable for execution by a computing apparatus for producing a set of filter coefficients, the filter coefficients being suitable for use by a filter, said computing apparatus comprising:

a) a memory unit;

b) a processor operatively connected to said memory unit, said program element when executing on said processor being operative for:

i. receiving a sequence of samples of a first signal;

ii. receiving a sequence of samples of a second signal, the second signal including a certain component which is correlated to the first signal;

iii. generating a first set of filter coefficients at least in part on the basis of said first and second signals, the first set of filter coefficients being such that when the first set of filter coefficients is applied by a filter on the first signal, a first estimate of the certain component in the second signal is generated;

iv. generating a set of performance data elements for a filter using the first set of filter coefficients, each performance data element being associated to a respective frequency band selected from a set of frequency bands;

v. determining for each frequency band in the set of frequency bands if the associated performance data element is indicative of a satisfactory performance or an unsatisfactory performance;

vi. generating a set of correction signals including a correction signal for each frequency band where the associated performance data element is indicative of an unsatisfactory performance;

vii. generating a second set of filter coefficients at least in part on the basis of:
     (a) said first signal;
     (b) said second signal; and
     (c) said set of correction signals;
     the second set of filter coefficients being such that when the second set of filter coefficients is applied by a filter on the first signal, a second estimate of the certain component in the second signal is generated;

viii. releasing a signal indicative of the second set of filter coefficients in a format suitable for use by a filter.

22. A computer readable medium as defined in claim 21, wherein a correction signal in said set of correction signals is indicative of a signal having its signal energy substantially within the frequency band for which it was generated.

23. A computer readable medium as defined in claim 21, wherein the performance data elements are indicative of error signal amplitude estimates for respective frequency bands selected from the set of frequency bands.

24. A computer readable medium as defined in claim 23, wherein a performance data element is indicative of an unsatisfactory performance if it is indicative of an error amplitude estimate that exceeds a certain threshold.

25. A computer readable medium as defined in claim 24, wherein the error amplitude estimate is indicative of a standard deviation estimate.

26. A computer readable medium as defined in claim 21, wherein said program element when executing on said processor being operative for:

a) generating a first set of contextual information data elements at least in part on the basis of said first and second signals;

b) generating the first set of filter coefficient at least in part on the basis of the first set of contextual information data elements;

c) processing the first set of contextual information data elements at least in part on the basis of the set of correction signals to generate a modified set of contextual information data elements;

d) processing the modified set of contextual information data elements to generate the second set of filter coefficients.

27. A computer readable medium as defined in claim 26, wherein said first set of contextual information data elements comprises:

a) a set of auto-correlation data elements for the sequence of samples of the first signal;

b) a set of cross-correlation data elements for the sequence of samples of the first signal and the sequence of samples of the second signal.

28. A computer readable medium as defined in claim 27, wherein said program element when executing on said processor is operative for modifying the set of auto-correlation data elements on the basis of said set of correction signals.

29. A computer readable medium as defined in claim 28, wherein said set of auto-correlation data elements forms a two-dimensional auto-correlation matrix data structure including a plurality of entries, said program element when executing on said processor being operative for modifying the entries of the two-dimensional matrix data structure one the basis of said set of correction signals.

30. A computer readable medium as defined in claim 29, wherein said program element when executing on said processor being operative for:

a) applying a Cholesky decomposition method to the auto-correlation matrix data structure to derive a lower triangular matrix data structure and an upper triangular matrix data structure;

b) processing the lower triangular matrix data structure and the upper triangular matrix data structure on the basis of the set of cross-correlation data elements to derive the second set of filter coefficients.

31. An adaptive filter comprising:
a) a first input for receiving a sequence of samples from a first signal;
b) a second input for receiving a sequence of samples of a second signal, the second signal including a component which is correlated to the first signal;
c) a filter adaptation unit operatively coupled to said first and second inputs, said filter adaptation unit comprising:
  i. a coefficient generation unit operative for generating a first set of filter coefficients at least in part on the basis of said first and second signals, the first set of filter coefficients being such that when the first set of filter coefficients is applied by a filter on the first signal, a first estimate of the certain component in the second signal is generated;
  ii. a performance evaluation unit operative for generating a set of performance data elements for a filter using the first set of filter coefficients, each performance data element being associated to a respective frequency band selected from a set of frequency bands;
  iii. a noise reduction unit operative for:
    (a) determining for each frequency band in the set of frequency bands if the associated performance data element is indicative of a satisfactory performance or an unsatisfactory performance;
    (b) generating a set of correction signals including a correction signal for each frequency band where the associated performance data element is indicative of an unsatisfactory performance;
    (c) generating a second set of filter coefficients at least in part on the basis of:
      (a) said first signal;
      (b) said second signal; and
      (c) said set of correction signals;
      the second set of filter coefficients being such that when the second set of filter coefficients is applied by a filter on the first signal, a second estimate of the certain component in the second signal is generated;
  iv. an output for releasing a signal indicative of the second set of filter coefficients in a format suitable for use by a filter;
d) a filter operatively coupled to said first input and to the output of said filter adaptation unit, said filter being operative to apply a filtering operation to the first signal on the basis of the second set of filter coefficients received from said filter adaptation unit to generate an estimate of the component in the second signal, the component being correlated to the first signal.

32. An echo cancellor comprising the adaptive filter of claim 31.

33. A filter adaptation unit suitable for producing a set of filter coefficients, said filter adaptation unit comprising:
a) means for receiving a sequence of samples of a first signal;
b) means for receiving a sequence of samples of a second signal, the second signal including a certain component which is correlated to the first signal;
c) means for generating a first set of filter coefficients at least in part on the basis of said first and second signals, the first set of filter coefficients being such that when the first set of filter coefficients is applied by a filter on the first signal, a first estimate of the certain component in the second signal is generated;
d) means for generating a set of performance data elements for a filter using the first set of filter coefficients, each performance data element being associated to a respective frequency band selected from a set of frequency bands;
e) means for determining for each frequency band in the set of frequency bands if the associated performance data element is indicative of a satisfactory performance or an unsatisfactory performance;
f) means for generating a set of correction signals including a correction signal for each frequency band where the associated performance data element is indicative of an unsatisfactory performance;
g) means for generating a second set of filter coefficients at least in part on the basis of:
  i. said first signal;
  ii. said second signal; and
  iii. said set of correction signals;
  the second set of filter coefficients being such that when the second set of filter coefficients is applied by a filter on the first signal, a second estimate of the certain component in the second signal is generated;
h) means for releasing a signal indicative of the second set of filter coefficients in a format suitable for use by a filter.

* * * * *